(12) United States Patent
Sheen et al.

(10) Patent No.: US 12,520,627 B2
(45) Date of Patent: Jan. 6, 2026

(54) METHOD OF MANUFACTURING LIGHT-EMITTING ELEMENT, AND LIGHT-EMITTING ELEMENT ARRAY SUBSTRATE AND DISPLAY DEVICE INCLUDING THE SAME

(71) Applicant: SAMSUNG DISPLAY CO., LTD., Yongin-si (KR)

(72) Inventors: Mi Hyang Sheen, Anyang-si (KR); Ki Young Yeon, Yongin-si (KR); Do Hyung Kim, Cheonan-si (KR); Kyung Lae Rho, Suwon-si (KR); Na Ri Ahn, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 258 days.

(21) Appl. No.: 17/479,980

(22) Filed: Sep. 20, 2021

(65) Prior Publication Data
US 2022/0158030 A1    May 19, 2022

(30) Foreign Application Priority Data
Nov. 16, 2020  (KR) .......................... 10-2020-0152592

(51) Int. Cl.
*H10H 20/813*    (2025.01)
*H01L 25/075*    (2006.01)
(Continued)

(52) U.S. Cl.
CPC ....... *H10H 20/821* (2025.01); *H01L 25/0753* (2013.01); *H10H 20/01* (2025.01); *H10H 20/815* (2025.01)

(58) Field of Classification Search
CPC .............................. H01L 33/08; H10H 20/813
(Continued)

(56) References Cited

U.S. PATENT DOCUMENTS 9,508,898 B2   11/2016  Chung et al.
11,367,823 B2   6/2022  Kim et al.
(Continued)

FOREIGN PATENT DOCUMENTS

JP    2008-78603 A    4/2008
KR   10-1553241 B1   9/2015
(Continued)

*Primary Examiner* — Hsin Yi Hsieh
(74) *Attorney, Agent, or Firm* — Womble Bond Dickinson (US) LLP

(57) ABSTRACT

A method of manufacturing a light-emitting element, and a light-emitting element array substrate and a display device including the same are provided. A method of manufacturing a light-emitting element includes: forming a base substrate including a plurality of protrusions and a rod area which is a remaining area except for the plurality of protrusions; forming a buffer layer on the base substrate; forming a semiconductor structure including a first semiconductor material layer, a light-emitting material layer, and a second semiconductor material layer on the buffer layer; forming a plurality of mask patterns overlapping the rod area on the semiconductor structure; forming element rods by removing the semiconductor structure overlapping the plurality of protrusions using the plurality of mask patterns; forming an insulating film around an outer surface of each of the element rods. and separating the element rods from the buffer layer.

4 Claims, 18 Drawing Sheets

(51) Int. Cl.
*H10H 20/01* (2025.01)
*H10H 20/815* (2025.01)
*H10H 20/821* (2025.01)

(58) Field of Classification Search
USPC .......................................................... 257/88
See application file for complete search history.

(56) References Cited

U.S. PATENT DOCUMENTS

| | | | |
|---|---|---|---|
| 11,811,012 B2 | 11/2023 | Kim et al. | |
| 2008/0070413 A1* | 3/2008 | Chen | H01L 21/0242 |
| | | | 438/700 |
| 2013/0126081 A1* | 5/2013 | Hu | H01L 24/83 |
| | | | 257/E33.056 |
| 2016/0064608 A1* | 3/2016 | Chung | H01L 33/18 |
| | | | 257/13 |
| 2019/0378953 A1* | 12/2019 | Min | H10H 20/831 |
| 2020/0388723 A1* | 12/2020 | Ahmed | H01L 33/42 |
| 2024/0063359 A1 | 2/2024 | Kim et al. | |

FOREIGN PATENT DOCUMENTS

| | | |
|---|---|---|
| KR | 10-2016-0027352 A | 3/2016 |
| KR | 10-2019-0096475 A | 8/2019 |
| KR | 10-2019-0124359 A | 11/2019 |
| KR | 10-2019-0140545 A | 12/2019 |
| KR | 10-2056414 B1 | 1/2020 |

\* cited by examiner

METHOD OF MANUFACTURING LIGHT-EMITTING ELEMENT, AND LIGHT-EMITTING ELEMENT ARRAY SUBSTRATE AND DISPLAY DEVICE INCLUDING THE SAME

CROSS-REFERENCE TO RELATED APPLICATION

This application claims priority to and the benefit of Korean Patent Application No. 10-2020-0152592, filed on Nov. 16, 2020 in the Korean Intellectual Property Office, the entire disclosure of which is incorporated herein by reference.

BACKGROUND

1. Field

Aspects of embodiments of the present disclosure relate to a method of manufacturing a light-emitting element, and a light-emitting element array substrate and a display device including the same.

2. Description of the Related Art

The importance of display devices is increasing with the development of multimedia. Accordingly, various types of display devices, such as an organic light-emitting display (OLED) device, a liquid crystal display (LCD) device, and the like, are being used.

Display devices are devices that display an image and include a display panel such as an OLED panel or an LCD panel. Among these, the display device may include a light-emitting element as a light-emitting display panel. For example, a light-emitting diode (LED) may include an organic LED that uses an organic material as a fluorescent material, an inorganic LED that uses an inorganic material as a fluorescent material, or the like.

SUMMARY

According to an aspect of embodiments of the present disclosure, a method of manufacturing a light-emitting element in which light emission efficiency is improved by reducing threading dislocations (dislocation defects) is provided.

According to further aspects of embodiments of the present disclosure, a light-emitting element array substrate in which light emission efficiency is improved by reducing threading dislocations, and a display device including the same, are provided.

According to one or more embodiments of the present disclosure, a method of manufacturing a light-emitting element comprises: forming a base substrate including a plurality of protrusions and a rod area which is a remaining area except for the plurality of protrusions, forming a buffer layer on the base substrate, forming a semiconductor structure including a first semiconductor material layer, a light-emitting material layer, and a second semiconductor material layer on the buffer layer, forming a plurality of mask patterns overlapping the rod area on the semiconductor structure, forming element rods by removing the semiconductor structure overlapping the plurality of protrusions using the plurality of mask patterns, forming an insulating film around an outer surface of each of the element rods, and separating the element rods from the buffer layer.

In an embodiment, the plurality of protrusions are spaced apart from each other, and the rod area is continuous between the plurality of protrusions.

In an embodiment, the plurality of protrusions are formed in a dot type, and the rod area is formed in a mesh type.

In an embodiment, each of the plurality of protrusions has a conical shape or a pyramid shape.

In an embodiment, before the separating of the element rods, the element rods are formed to overlap the rod area and not to overlap the plurality of protrusions.

In an embodiment, each of the element rods is formed to be adjacent to a vertex of a planar shape of a protrusion of the plurality of protrusions.

In an embodiment, each of the element rods overlaps at least a portion of a protrusion of the plurality of protrusions.

In an embodiment, each of the plurality of element rods is formed to overlap at least one side of a planar shape of a protrusion of the plurality of protrusions.

In an embodiment, in the forming of the semiconductor structure, the first semiconductor material layer is formed on the buffer layer, the light-emitting material layer is formed on the first semiconductor material layer, and the second semiconductor material layer is formed on the light-emitting material layer.

In an embodiment, the forming of the semiconductor structure further includes forming an electrode material layer between the buffer layer and the first semiconductor material layer or forming the electrode material layer on the second semiconductor material layer.

According to one or more embodiments of the present disclosure, a light-emitting element array substrate comprises: a base substrate including a plurality of protrusions and a rod area which is a remaining area except for the plurality of protrusions, a buffer layer on the base substrate, a plurality of element rods spaced apart from each other on the buffer layer and each including a first semiconductor material layer, a light-emitting material layer, a second semiconductor material layer, and an electrode material layer which overlap the rod area, and an insulating film around an outer surface of each of the plurality of element rods.

In an embodiment, the plurality of element rods do not overlap the plurality of protrusions.

In an embodiment, each of the plurality of element rods is adjacent to a vertex of a planar shape of a protrusion of the plurality of protrusions.

In an embodiment, at least a portion of each of the plurality of element rods overlaps a protrusion of the plurality of protrusions.

In an embodiment, a planar area of an element rod of the plurality of element rods overlapping a protrusion of the plurality of protrusions is 50% or less.

In an embodiment, each of the plurality of element rods overlaps at least one side of a planar shape of a protrusion of the plurality of protrusions.

In an embodiment, when the light-emitting element array substrate is irradiated with ultraviolet light such that the plurality of element rods emit light, a ratio of the plurality of element rods that normally emit light is 35% or more.

In an embodiment, each of the plurality of protrusions has a conical shape or a pyramid shape.

In an embodiment, each of the plurality of element rods includes the first semiconductor material layer, the light-emitting material layer arranged on the first semiconductor material layer, and the second semiconductor material layer arranged on the light-emitting material layer.

According to one or more embodiments of the present disclosure, a display device comprises: a first electrode and a second electrode which extend in a direction and are spaced apart from each other on a substrate, an insulating layer on the first electrode and the second electrode, a plurality of light-emitting elements on the insulating layer between the first electrode and the second electrode, and a first contact electrode in contact with a first end portion of each of the plurality of light-emitting elements and a second contact electrode in contact with a second end portion of each of the plurality of light-emitting elements, wherein, when the plurality of light-emitting elements is irradiated with ultraviolet light to emit light, a ratio of the plurality of light-emitting elements that normally emit light is 35% or more.

However, aspects and objects of the present disclosure are not limited to the above-described aspects and objects, and other aspects and objects of the present disclosure will be apparent to those skilled in the art from the following descriptions.

BRIEF DESCRIPTION OF THE DRAWINGS

The above and other aspects and features of the present disclosure will become more apparent by describing some embodiments thereof in further detail with reference to the attached drawings, in which.

DETAILED DESCRIPTION

Figure 1:
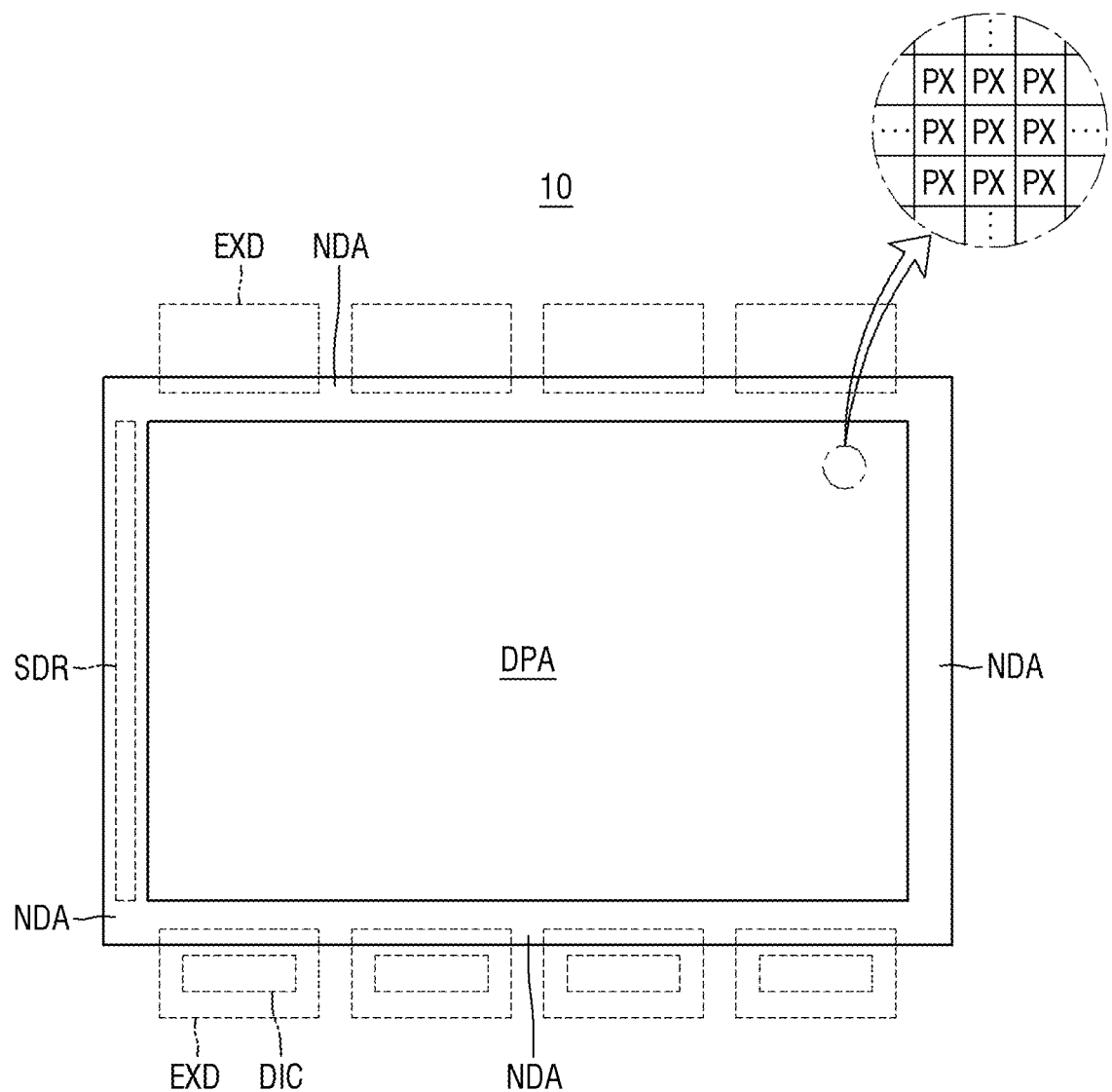
FIG. 1 is a schematic plan view of a display device according to an embodiment.

The present invention will now be described more fully herein with reference to the accompanying drawings, in which some embodiments of the invention are shown. The present invention may, however, be embodied in different forms and should not be construed as limited to the embodiments set forth herein. Rather, these embodiments are provided so that this disclosure will be thorough and complete, and will fully convey the scope of the invention to those skilled in the art.

It is to be understood that when a layer is referred to as being "on" another layer or substrate, it may be directly on the other layer or substrate, or one or more intervening layers may also be present. The same reference numbers indicate the same or like components throughout the specification.

It is to be understood that, although the terms "first," "second," etc. may be used herein to describe various elements, these elements should not be limited by these terms. These terms are used to distinguish one element from another element. For instance, a first element discussed below could be termed a second element without departing from the teachings of the present invention. Similarly, the second element could also be termed the first element.

Each of the features of the various embodiments of the present disclosure may be combined with each other, in part or in whole. Each embodiment may be implemented independently of each other or may be implemented together in an association.

Spatially relative terms, such as "beneath," "below," "lower," "above," "upper," "bottom," "top," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (e.g., rotated 90 degrees or at other orientations), and the spatially relative descriptors used herein should be interpreted accordingly.

Unless otherwise defined, all terms (including technical and scientific terms) used herein have the same meaning as commonly understood by one of ordinary skill in the art to which the present disclosure belongs. It is to be further understood that terms, such as those defined in commonly used dictionaries, should be interpreted as having a meaning that is consistent with their meaning in the context of the relevant art and/or the present disclosure, and should not be interpreted in an idealized or overly formal sense, unless expressly so defined herein.

Herein, some embodiments will be described with reference to the accompanying drawings.

FIG. 1 is a schematic plan view of a display device according to an embodiment.

Referring to FIG. 1, a display device 10 may display a video or a still image. The display device 10 may refer to any of electronic devices that provide a display screen. For example, the display device 10 may include any of a television, a notebook, a monitor, an advertising board, an Internet of Things (IoT) device, a mobile phone, a smartphone, a tablet personal computer (PC), an electronic watch, a smart watch, a watch phone, a head mounted display, a mobile communication terminal, an electronic organizer, an electronic book reader, a portable multimedia player (PMP), a navigation device, a game machine, a digital camera, a camcorder, and the like, which provide a display screen.

The display device 10 includes a display panel that provides a display screen. Examples of the display panel may include any of an inorganic light-emitting diode display panel, an organic light-emitting display panel, a quantum dot light-emitting display panel, a plasma display panel, a field emission display panel, and the like. Herein, although a case in which the inorganic light-emitting diode display panel as an example of the display panel is applied is described, the present disclosure is not limited thereto, and other display panels may be applied.

A shape of the display device 10 may be variously modified. For example, the display device 10 may have any of shapes such as a rectangular shape of which lateral sides are long, a rectangular shape of which longitudinal sides are long, a square shape, a quadrangular shape of which corner portions (vertexes) are round, other polygonal shapes, a circular shape, and the like. A shape of a display area DPA of the display device 10 may also be similar to the overall shape of the display device 10. In FIG. 1, the display device 10 and the display area DPA, which have a rectangular shape of which lateral sides are long, are illustrated.

The display device 10 may include the display area DPA and a non-display area NDA. The display area DPA is an area in which an image may be displayed, and the non-display area NDA is an area in which an image is not displayed. The display area DPA may refer to an active area, and the non-display area NDA may refer to an inactive area. In an embodiment, the display area DPA may generally occupy a center of the display device 10.

The display area DPA may include a plurality of pixels PX. The plurality of pixels PX may be arranged in a matrix form. A shape of each of the pixels PX may be a rectangular shape or a square shape in a plan view, but the present disclosure is not limited thereto, and the shape may be a rhombus shape of which each side is inclined with respect to a direction. In an embodiment, the pixels PX may be alternately arranged in a stripe type or a PenTile type. In addition, each of the pixels PX may include one or more light-emitting elements 30 that emit light at a certain, or specific, wavelength band, thereby displaying a certain, or specific, color.

The non-display area NDA may be disposed around the display area DPA. The non-display area NDA may completely or partially surround the display area DPA. In an embodiment, the display area DPA has a rectangular shape, and the non-display area NDA may be disposed adjacent to four sides of the display area DPA. The non-display area NDA may form a bezel of the display device 10.

In the non-display area NDA, a driving circuit or driving element which drives the display area DPA may be disposed. In an embodiment, in the non-display area NDA disposed adjacent to a first long side (a lower side in FIG. 1) and the non-display area NDA disposed adjacent to a second long side (an upper side in FIG. 1) of the display device 10, pads may be provided on a display substrate of the display device 10, and an external device EXD may be mounted on a pad electrode of the pad. Examples of the external device EXD may include a connecting film, a printed circuit board, a driving chip (DIC), a connector, a wiring connection film, and the like. In the non-display area NDA disposed adjacent to a first short side (a left side in FIG. 1) of the display device 10, a scan driver SDR or the like directly formed on the display substrate of the display device 10 may be disposed.

Figure 2:
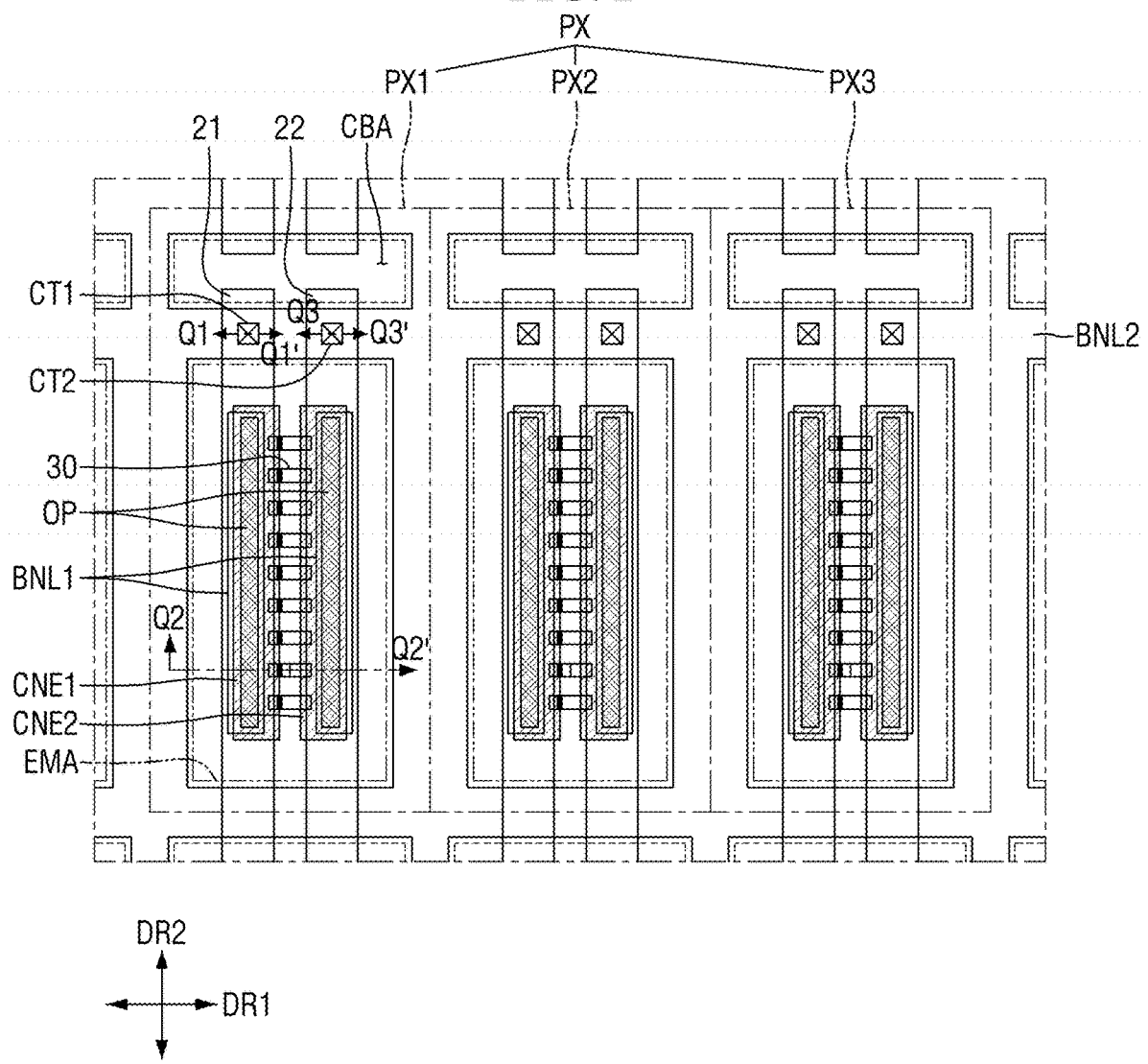
FIG. 2 is a plan view illustrating a pixel of the display device according to an embodiment.

FIG. 2 is a plan view illustrating a pixel of the display device according to an embodiment.

Referring to FIG. 2, each of the plurality of pixels PX may include a plurality of subpixels PXn (n is an integer from one to three). For example, one pixel PX may include a first subpixel PX1, a second subpixel PX2, and a third subpixel PX3. The first subpixel PX1 may emit light having a first color, the second subpixel PX2 may emit light having a second color, and the third subpixel PX3 may emit light having a third color. As an example, the first color may be a blue color, the second color may be a green color, and the third color may be a red color. However, the present disclosure is not limited thereto, and the subpixels PXn may emit light having a same color. In addition, in FIG. 2, the pixel PX is illustrated as including three subpixels PXn, but is not limited thereto, and may include a larger number of subpixels PXn.

Each of the subpixels PXn of the display device 10 may include a light-emitting area EMA and a non-light-emitting area (not shown). The light-emitting area EMA may be an area in which the light-emitting element 30 is disposed such that light having a certain, or specific, wavelength band is emitted, and the non-light-emitting area may be an area in which the light-emitting element 30 is not disposed such that light emitted from the light-emitting element 30 does not reach and is not emitted. The light-emitting area EMA may include an area in which the light-emitting element 30 is disposed, and may include an area which is adjacent to the light-emitting element 30 and through which light emitted from the light-emitting element 30 is emitted.

The present disclosure is not limited thereto, and the light-emitting area EMA may also include an area in which the light emitted from the light-emitting element 30 is reflected or refracted due to another member to be emitted. A plurality of light-emitting elements 30 may be disposed in each of the subpixels PXn, and an area in which the plurality of light-emitting elements 30 is disposed and an area adjacent to the area may form an emission area.

In the light-emitting area EMA, contact electrodes CNE1 and CNE2, which overlap electrodes 21 and 22 and are in contact with a first side and a second side of each of the light-emitting elements 30, respectively, may be disposed. The contact electrodes CNE1 and CNE2 may be respectively connected to the electrodes 21 and 22 through openings OP. A further detailed structure of the electrodes 21 and 22 and the contact electrodes CNE1 and CNE2 will be described below.

Further, each subpixel PXn may include a cut-out area CBA disposed in the non-light-emitting area. The cut-out area CBA may be disposed at one side of the light-emitting area EMA in a second direction DR2. The cut-out area CBA may be disposed between the light-emitting areas EMA of the adjacent subpixels PXn in the second direction DR2. A plurality of light-emitting areas EMA and a plurality of cut-out areas CBA may be arranged in the display area DPA of the display device 10. For example, each of the plurality of light-emitting area EMA and the plurality of cut-out areas CBA may be repeatedly arranged in a first direction DR1, and the light-emitting area EMA and the cut-out area CBA may be alternately arranged in the second direction DR2. In addition, a separation distance between the cut-out areas CBA in the first direction DR1 may be less than a separation distance between the light-emitting areas EMA in the first direction DR1. A second bank BNL2 may be disposed between the cut-out areas CBA and between the light-emitting areas EMA, and a distance therebetween may vary according to a width of the second bank BNL2. Since the light-emitting element 30 is not disposed in the cut-out area CBA, light is not emitted through the cut-out areas CBA, but some of the electrodes 21 and 22 disposed in each subpixel PXn may be disposed in the cut-out area CBA. The electrodes 21 and 22 disposed in each subpixel PXn may be disposed to be separated from each other in the cut-out area CBA.

Figure 3:
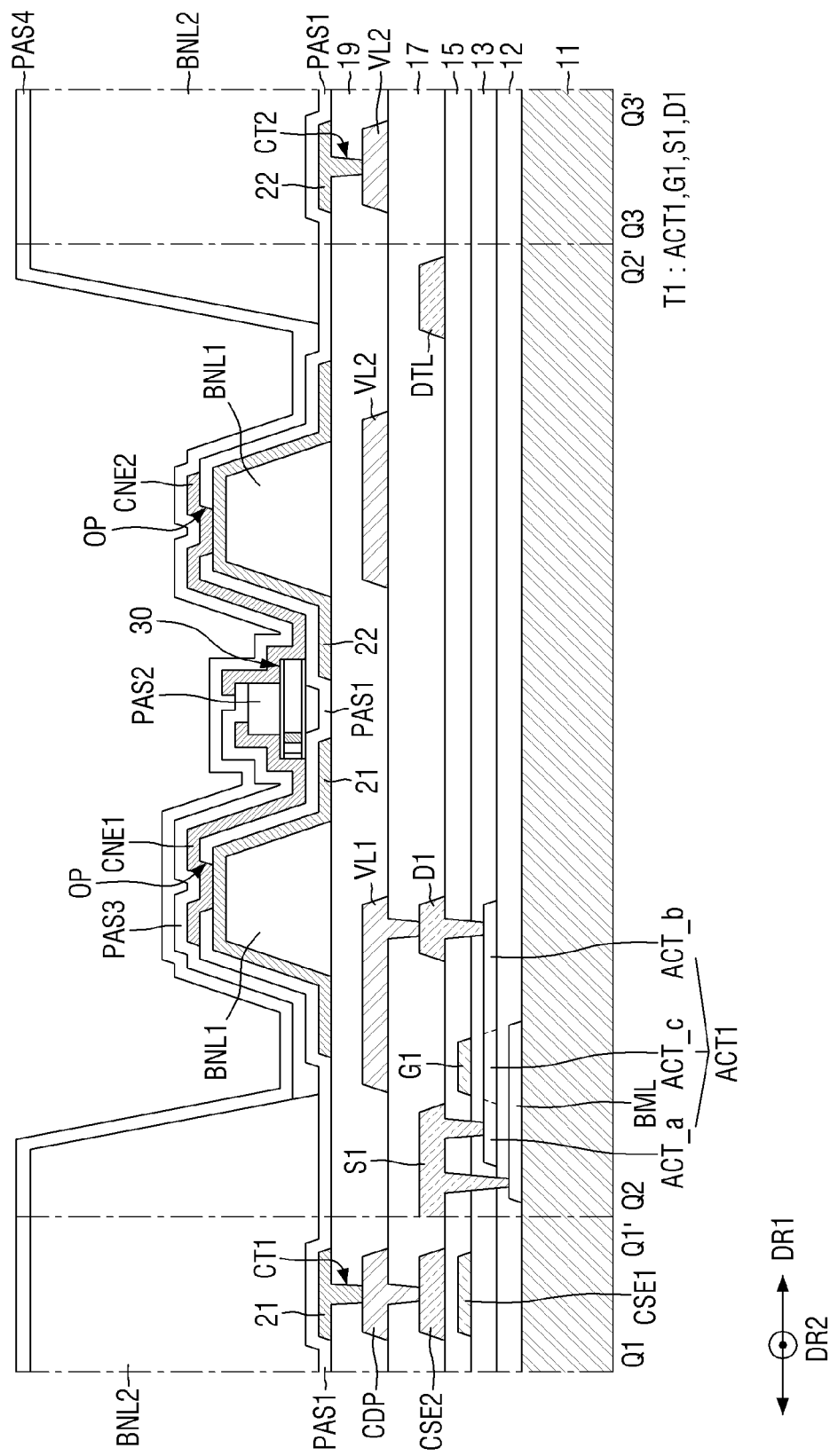
FIG. 3 is a cross-sectional view taken along the lines Q1-Q1', Q2-Q2', and Q3-Q3' of FIG. 2.

FIG. 3 is a cross-sectional view taken along the lines Q1-Q1', Q2-Q2', and Q3-Q3' of FIG. 2. FIG. 3 illustrates a cross-section traversing both end portions of the light-emitting element 30 disposed in the first subpixel PX1 of FIG. 2.

Referring to FIG. 3 together with FIG. 2, the display device 10 may include a substrate 11, and a semiconductor layer, a plurality of conductive layers, and a plurality of insulating layers disposed on the substrate 11. The semiconductor layer, the conductive layers, and the insulating layers may form a circuit layer and a light-emitting element layer of the display device 10.

The substrate 11 may be an insulating substrate. The substrate 11 may be made of an insulating material, such as glass, quartz, a polymer resin, or the like. In addition, the substrate 11 may be a rigid substrate but may also be a flexible substrate that is bendable, foldable, rollable, or the like.

A light-blocking layer BML may be disposed on the substrate 11. The light-blocking layer BML is disposed to overlap an active layer ACT1 of a first transistor T1 of the display device 10. The light-blocking layer BML may include a material that blocks light, thereby preventing or substantially preventing light from being incident on the active layer ACT1 of the first transistor T1. For example, the light-blocking layer BML may be made of an opaque metal material that blocks light from being transmitted. However, the present disclosure is not limited thereto, and, in some cases, the light-blocking layer BML may be omitted.

In an embodiment, a buffer layer 12 may be entirely disposed on the substrate 11 including the light-blocking layer BML. The buffer layer 12 may be formed on the substrate 11 to protect the first transistor T1 of the pixel PX from moisture permeating through the substrate 11 that is vulnerable to moisture permeation, and may perform a surface planarization function. In an embodiment, the buffer layer 12 may be formed of a plurality of inorganic layers that are alternately stacked. For example, the buffer layer 12 may be formed of multiple layers in which inorganic layers including at least one of silicon oxide ($SiO_x$), silicon nitride ($SiN_x$), and silicon oxynitride (SiON) are alternately stacked.

The semiconductor layer is disposed on the buffer layer 12. The semiconductor layer may include the active layer ACT1 of the first transistor T1. The semiconductor layer and the active layer ACT1 may be disposed to partially overlap a gate electrode G1 or the like of a first gate conductive layer to be described below.

Meanwhile, in the drawing, only the first transistor T1 among transistors included in the subpixel PXn of the display device 10 is illustrated, but the present disclosure is not limited thereto. The display device 10 may include a larger number of transistors. For example, the display device 10 may further include one or more transistors in addition to the first transistor T1 and, for example, may include two or three transistors for each subpixel PXn.

The semiconductor layer may include polycrystalline silicon, single crystal silicon, an oxide semiconductor, or the like. When the semiconductor layer includes an oxide semiconductor, each active layer ACT1 may include a plurality of conductive areas ACTa and ACTb and a channel area ACTc therebetween. In an embodiment, the oxide semiconductor may be an oxide semiconductor including indium (In). For example, the oxide semiconductor may include indium-tin oxide (ITO), indium-zinc oxide (IZO), indium-gallium oxide (IGO), indium-zinc-tin oxide (IZTO), indium-gallium-tin oxide (IGTO), indium-gallium-zinc-tin oxide (IGZTO), or the like.

In another embodiment, the semiconductor layer may include polycrystalline silicon. Polycrystalline silicon may be formed by crystallizing amorphous silicon, and, in this case, the conductive areas of the active layer ACT1 may be doped areas that are doped with impurities.

A first gate insulating layer 13 is disposed on the semiconductor layer and the buffer layer 12. The first gate insulating layer 13 may be disposed on the buffer layer 12 and the semiconductor layer. The first gate insulating layer 13 may serve as a gate insulating film of each transistor. The first gate insulating layer 13 may be formed of an inorganic layer including an inorganic material, such as any of silicon oxide ($SiO_x$), silicon nitride ($SiN_x$), and silicon oxynitride (SiON), or a stacked structure thereof.

The first gate conductive layer is disposed on the first gate insulating layer 13. The first gate conductive layer may include the gate electrode G1 of the first transistor T1 and a first capacitor electrode CSE1 of a storage capacitor. The gate electrode G1 may be disposed to overlap the channel area ACTc of the active layer ACT1 in a thickness direction. The first capacitor electrode CSE1 may be disposed to overlap a second capacitor electrode CSE2 to be described below in the thickness direction. In one embodiment, the first capacitor electrode CSE1 may be connected to and integrated with the gate electrode G1. The first capacitor electrode CSE1 may be disposed to overlap the second capacitor electrode CSE2 in the thickness direction, and the storage capacitor may be formed therebetween.

The first gate conductive layer may be formed of a single layer or a multi-layer that is made of one of molybdenum (Mo), aluminum (Al), chromium (Cr), gold (Au), titanium (Ti), nickel (Ni), neodymium (Nd), and copper (Cu), or an alloy thereof. However, the present disclosure is not limited thereto.

A first interlayer insulating layer 15 is disposed on the first gate conductive layer. The first interlayer insulating layer 15 may serve as an insulating film between the first gate conductive layer and other layers disposed thereon. In addition, the first interlayer insulating layer 15 may be disposed to cover the first gate conductive layer and to perform a function of protecting the first gate conductive layer. The first interlayer insulating layer 15 may be formed of an inorganic layer including an inorganic material, such as any of silicon oxide ($SiO_x$), silicon nitride ($SiN_x$), and silicon oxynitride (SiON), or a stacked structure thereof.

A first data conductive layer is disposed on the first interlayer insulating layer 15. The first data conductive layer may include a first source electrode S1 and a first drain electrode D1 of the first transistor T1, a data line DTL, and the second capacitor electrode CSE2.

The first source electrode S1 and the first drain electrode D1 of the first transistor T1 may be in contact with the conductive areas ACTa and ACTb of the active layer ACT1, respectively, through contact holes passing through a second interlayer insulating layer 17 and the first gate insulating layer 13. In addition, the first source electrode S1 of the first transistor T1 may be electrically connected to the light-blocking layer BML through another contact hole.

A data signal may be applied to another transistor (not shown) included in the display device 10 through the data line DTL. Although not shown in the drawing, the data line DTL may be connected to source and drain electrodes of another transistor such that a signal applied from the data line DTL may be transmitted thereto.

The second capacitor electrode CSE2 is disposed to overlap the first capacitor electrode CSE1 in the thickness direction. In an embodiment, the second capacitor electrode CSE2 may be integrated with and connected to the first source electrode S1.

The first data conductive layer may be formed of a single layer or a multi-layer that is made of one of molybdenum (Mo), aluminum (Al), chromium (Cr), gold (Au), titanium (Ti), nickel (Ni), neodymium (Nd), and copper (Cu), or an alloy thereof. However, the present disclosure is not limited thereto.

The second interlayer insulating layer 17 is disposed on the first data conductive layer. The second interlayer insulating layer 17 may serve as an insulating film between the first data conductive layer and other layers disposed thereon. In addition, the second interlayer insulating layer 17 may cover the first data conductive layer to perform a function of protecting the first data conductive layer. The second interlayer insulating layer 17 may be formed of an inorganic layer including an inorganic material, such as any of silicon oxide ($SiO_x$), silicon nitride ($SiN_x$), and silicon oxynitride (SiON), or a stacked structure thereof.

A second data conductive layer is disposed on the second interlayer insulating layer 17. The second data conductive layer may include a first voltage line VL1, a second voltage line VL2, and a first conductive pattern CDP. A high potential voltage (or a first power voltage) to be supplied to the first transistor T1 may be applied to the first voltage line VL1, and a low potential voltage (or a second power voltage) to be supplied to the second electrode 22 may be applied to the second voltage line VL2. In addition, during the manufacturing process of the display device 10, an alignment signal to align the light-emitting elements 30 may be applied to the second voltage line VL2.

The first conductive pattern CDP may be connected to the second capacitor electrode CSE2 through a contact hole formed in the second interlayer insulating layer 17. In an embodiment, the second capacitor electrode CSE2 may be integrated with the first source electrode S1 of the first transistor T1, and the first conductive pattern CDP may be electrically connected to the first source electrode S1. The first conductive pattern CDP may also be in contact with the first electrode 21 to be described below, and the first transistor T1 may transmit the first power voltage applied from the first voltage line VL1 to the first electrode 21 through the first conductive pattern CDP. In the drawing, the second data conductive layer is illustrated as including one second voltage line VL2 and one first voltage line VL1, but the present disclosure is not limited thereto. For example, the second data conductive layer may include a larger number of first voltage lines VL1 and a larger number of second voltage lines VL2.

In an embodiment, the second data conductive layer may be formed of a single layer or a multi-layer that is made of one of molybdenum (Mo), aluminum (Al), chromium (Cr), gold (Au), titanium (Ti), nickel (Ni), neodymium (Nd), and copper (Cu), or an alloy thereof. However, the present disclosure is not limited thereto.

A first planarization layer 19 is disposed on the second data conductive layer. The first planarization layer 19 may include an organic insulating material, for example, an organic material, such as polyimide (PI), and may perform a surface planarization function.

A plurality of first banks BNL1, the first and second electrodes 21 and 22, the light-emitting element 30, the first and second contact electrodes CNE1 and CNE2, and the second bank BNL2 are disposed on the first planarization layer 19. In addition, a plurality of insulating layers PAS1, PAS2, PAS3, and PAS4 may be disposed on the first planarization layer 19.

In an embodiment, the plurality of first banks BNL1 may be disposed directly on the first planarization layer 19. In an embodiment, each of the plurality of first banks BNL1 may have a shape extending in the second direction DR2 in each subpixel PXn, but may not extend to another adjacent subpixel PXn in the second direction DR2, and may be disposed in the light-emitting area EMA. In addition, the plurality of first banks BNL1 may be disposed to be spaced apart from each other in the first direction DR1, and the light-emitting element 30 may be disposed therebetween. The plurality of first banks BNL1 may be disposed for each subpixel PXn to form linear patterns in the display area DPA of the display device 10. Two first banks BNL1 are illustrated in the drawing, but the present disclosure is not limited thereto. A larger number of first banks BNL1 may be disposed depending on the number of electrodes 21 and 22.

The first bank BNL1 may have a structure of which at least a portion protrudes on the basis of an upper surface of the first planarization layer 19. The protruding portion of the first bank BNL1 may have inclined side surfaces, and light emitted from the light-emitting element 30 may be reflected from the electrodes 21 and 22 disposed on the first bank BNL1 and may be emitted in an upward direction of the first planarization layer 19. The first bank BNL1 may provide an area in which the light-emitting element 30 is disposed and may also serve as a reflective partition wall that reflects light emitted from the light-emitting element 30 upward. The side surface of the first bank BNL1 may be inclined in a linear shape, but the present disclosure is not limited thereto. In an embodiment, the first bank BNL1 may have an outer surface that has a curved semi-circular or semi-elliptical shape. The first banks BNL1 may include an organic insulating material, such as polyimide (PI), but the present disclosure is not limited thereto.

The plurality of electrodes 21 and 22 are disposed on the first banks BNL1 and the first planarization layer 19. The plurality of electrodes 21 and 22 may include the first electrode 21 and the second electrode 22. The first electrode 21 and the second electrode 22 may extend in the second direction DR2 and may be disposed to be spaced apart from each other in the first direction DR1.

The first electrode 21 and the second electrode 22 may each extend in the second direction DR2 in the subpixel PXn, and may be separated from other electrodes 21 and 22 in the cut-out area CBA. For example, the cut-out area CBA may be disposed between the light-emitting areas EMA of the adjacent subpixels PXn in the second direction DR2, and the first electrode 21 and the second electrode 22 may be separated from another first electrode 21 and another second electrode 22, which are disposed in an adjacent subpixel PXn in the second direction DR2, in the cut-out area CBA. However, the present disclosure is not limited thereto, and some electrodes 21 and 22 may not be separated for each subpixel PXn and may be disposed to extend beyond the adjacent subpixel PXn in the second direction DR2, or only one of the first electrode 21 and the second electrode 22 may be separated for each subpixel PXn.

The first electrode 21 may be electrically connected to the first transistor T1 through a first contact hole CT1, and the second electrode 22 may be electrically connected to the second voltage line VL2 through a second contact hole CT2. For example, the first electrode 21 may be in contact with the first conductive pattern CDP through the first contact hole CT1 passing through the first planarization layer 19 at a portion of the second bank BNL2, which extends in the first direction DR1. Also, the second electrode 22 may be in contact with the second voltage line VL2 through the second contact hole CT2 passing through the first planarization layer 19 at a portion of the second bank BNL2, which extends in the first direction DR1. However, the present disclosure is not limited thereto. In another embodiment, the first contact hole CT1 and the second contact hole CT2 may be disposed in the light-emitting area EMA surrounded by the second bank BNL2 so as not to overlap the second bank BNL2.

In the drawing, it is illustrated that one first electrode 21 and one second electrode 22 are disposed for each subpixel PXn, but the present disclosure is not limited thereto, and a larger number of first electrodes 21 and second electrodes 22 may be disposed for each subpixel PXn. In addition, the first electrode 21 and the second electrode 22 disposed in each subpixel PXn may not necessarily have a shape extending in one direction, and the first electrode 21 and the second electrode 22 may be disposed in various structures. For example, the first electrode 21 and the second electrode 22 may each have a partially curved or bent shape, and one electrode of the first electrode 21 and the second electrode 22 may be disposed to surround the other electrode thereof.

In an embodiment, each of the first electrode 21 and the second electrode 22 may be disposed directly on the first banks BNL1. Each of the first electrode 21 and the second electrode 22 may be formed to have a width greater than that of the first bank BNL1. For example, each of the first electrode 21 and the second electrode 22 may be disposed to cover an outer surface of the first bank BNL1. Each of the first electrode 21 and the second electrode 22 may be disposed on a side surface of the first bank BNL1, and a distance between the first electrode 21 and the second electrode 22 may be less than a distance between the first banks BNL1. In an embodiment, at least a partial area of each of the first electrode 21 and the second electrode 22 may be disposed directly on the first planarization layer 19 to be coplanar with each other. However, the present disclosure is not limited thereto. In some cases, the width of each of the electrodes 21 and 22 may be less than that of the first bank BNL1. However, each of the electrodes 21 and 22 may be disposed to cover at least one side surface of the first bank BNL1 to reflect light emitted from the light-emitting element 30.

Each of the electrodes 21 and 22 may include a conductive material having high reflectance. For example, as the conductive material having high reflectance, each of the electrodes 21 and 22 may include a metal, such as silver (Ag), copper (Cu), or aluminum (Al), or may include an alloy including Al, nickel (Ni), lanthanum (La), or the like. Each of the electrodes 21 and 22 may reflect light, which is emitted from the light-emitting element 30 and travels toward the side surface of the first bank BNL1, in an upward direction of each subpixel PXn.

However, the present disclosure is not limited thereto, and each of the electrodes 21 and 22 may further include a transparent conductive material. For example, each of the electrodes 21 and 22 may include a material such as indium tin oxide (ITO), indium zinc oxide (IZO), indium tin-zinc oxide (ITZO), or the like. In some embodiments, each of the electrodes 21 and 22 may be formed in a structure in which one or more layers of a transparent conductive material and a metal layer having high reflectance are stacked, or formed as a single layer including the transparent conductive material and the metal layer. For example, each of the electrodes 21 and 22 may have a stacked structure, such as ITO/silver (Ag)/ITO/, ITO/Ag/IZO, or ITO/Ag/ITZO/IZO.

The plurality of electrodes 21 and 22 may be electrically connected to the light-emitting elements 30 and may receive a voltage (e.g., a predetermined voltage) to allow the light-emitting elements 30 to emit light. The plurality of electrodes 21 and 22 may be electrically connected to the light-emitting elements 30 through the contact electrodes CNE1 and CNE2, and electrical signals applied to the electrodes 21 and 22 may be transmitted to the light-emitting elements 30 through the contact electrodes CNE1 and CNE2.

One of the first electrode 21 and the second electrode 22 may be electrically connected to an anode of the light-emitting element 30, and the other one thereof may be electrically connected to a cathode of the light-emitting element 30. However, the present disclosure is not limited thereto, and the reverse of the above description may be possible.

Further, each of the electrodes 21 and 22 may be utilized to form an electric field in the subpixel PXn, thereby aligning the light-emitting elements 30. The light-emitting elements 30 may be disposed between the first electrode 21 and the second electrode 22 due to the electric field formed on the first electrode 21 and the second electrode 22. In an embodiment, the light-emitting elements 30 of the display device 10 may be sprayed onto the electrodes 21 and 22 through an inkjet printing process. When an ink including the light-emitting elements 30 is sprayed onto the electrodes 21 and 22, an alignment signal is applied to the electrodes 21 and 22 to generate the electric field. The light-emitting elements 30 dispersed in the ink may be aligned on the electrodes 21 and 22 by receiving a dielectrophoretic force by the electric field generated on the electrodes 21 and 22.

A first insulating layer PAS1 is disposed on the first planarization layer 19. The first insulating layer PAS1 may be disposed to cover the first banks BNL1 and the first and second electrodes 21 and 22. The first insulating layer PAS1 may protect the first electrode 21 and the second electrode 22, and concurrently (e.g., simultaneously), insulate the first electrode 21 from the second electrode 22. In addition, the light-emitting element 30 disposed on the first insulating layer PAS1 may be prevented or substantially prevented from being damaged by being in direct contact with other members.

In an embodiment, the first insulating layer PAS1 may include openings OP that partially expose the first electrode 21 and the second electrode 22. Each of the openings OP may partially expose a portion of each of the electrodes 21 and 22, which is disposed on an upper surface of the first bank BNL1. A portion of each of the contact electrodes CNE1 and CNE2 may be in contact with each of the electrodes 21 and 22 exposed through the opening OP.

A step difference may be formed in the first insulating layer PAS1 such that a portion of an upper surface thereof is recessed between the first electrode 21 and the second electrode 22. For example, since the first insulating layer PAS1 is disposed to cover the first electrode 21 and the second electrode 22, the upper surface of the first insulating layer PAS1 may be stepped according to the shape of the electrodes 21 and 22 disposed below the first insulating layer PAS1. However, the present disclosure is not limited thereto.

The second bank BNL2 may be disposed on the first insulating layer PAS1. In an embodiment, the second bank BNL2 may be disposed in a grid pattern, which includes portions extending in the first direction DR1 and the second direction DR2 in a plan view, on an entire surface of the display area DPA. The second bank BNL2 may be disposed over boundaries of the subpixels PXn to distinguish the adjacent subpixels PXn.

Further, the second bank BNL2 may be disposed to surround the light-emitting area EMA and the cut-out area CBA disposed for each subpixel PXn to distinguish the light-emitting area EMA and the cut-out area CBA. The first electrode 21 and the second electrode 22 may extend in the second direction DR2 and may be disposed to cross a portion of the second bank BNL2 extending in the first direction DR1. In the portion of the second bank BNL2 extending in the second direction DR2, a portion disposed between the light-emitting areas EMA may have a width greater than that of a portion disposed between the cut-out areas CBA. Thus, the distance between the cut-out areas CBA may be less than the distance between the light-emitting areas EMA.

In an embodiment, the second bank BNL2 may be formed to have a height greater than that of the first bank BNL1. The second bank BNL2 may prevent or substantially prevent inks from overflowing to adjacent subpixels PXn in an inkjet printing process of a manufacturing process of the display device 10, thereby separating the inks, in which other light-emitting elements 30 are dispersed for different subpixels PXn, so as not to be mixed with each other. Like the first bank BNL1, the second bank BNL2 may include polyimide (PI), but the present disclosure is not limited thereto.

The light-emitting elements 30 may be disposed on the first insulating layer PAS1. The plurality of light-emitting elements 30 are disposed to be spaced apart from each other in the second direction DR2 in which each of the electrodes 21 and 22 extends and may be aligned substantially parallel to each other. The light-emitting element 30 may have a shape extending in a direction, and the extending direction of the light-emitting element 30 may be substantially perpendicular to the direction in which each of the electrodes 21 and 22 extends. However, the present disclosure is not limited thereto, and the light-emitting element 30 may be obliquely disposed without being perpendicular to the direction in which each of the electrodes 21 and 22 extends.

The light-emitting elements 30 disposed in each subpixel PXn may include light-emitting layers 36 (see FIG. 4) having different materials to emit light in different wavelength bands to the outside. Accordingly, light of a first color, a second color, and a third color may be emitted from the first subpixel PX1, the second subpixel PX2, and the third subpixel PX3, respectively. However, the present disclosure is not limited thereto, and, in an embodiment, the subpixels PXn may include the same type of light-emitting elements 30 to emit light of substantially a same color.

Both end portions of the light-emitting element 30 may be respectively disposed on the electrodes 21 and 22 between the first banks BNL1. An extended length of the light-emitting element 30 may be greater than the distance between the first electrode 21 and the second electrode 22, and both end portions of the light-emitting element 30 may be respectively disposed on the first electrode 21 and the second electrode 22. For example, the light-emitting element 30 may be disposed such that a first end portion thereof is placed on the first electrode 21 and a second end portion thereof is placed on the second electrode 22.

The light-emitting element 30 may include a plurality of layers disposed therein in a direction parallel to an upper surface of the substrate 11 or the first planarization layer 19. The light-emitting element 30 may be disposed such that a direction in which the light-emitting element 30 extends, is parallel to the upper surface of the first planarization layer 19, and a plurality of semiconductor layers included in the light-emitting element 30 may be sequentially disposed in the direction parallel to the upper surface of the first planarization layer 19. However, the present disclosure is not limited thereto, and, in a case in which the light-emitting element 30 has a different structure, the plurality of semiconductor layers may be disposed in a direction perpendicular to the upper surface of the first planarization layer 19.

Both end portions of the light-emitting element 30 may be in contact with the contact electrodes CNE1 and CNE2, respectively. For example, an insulating film 38 (see FIG. 4) is not formed on both end surfaces of the light-emitting element 30 extending in a direction such that some of the semiconductor layer and an electrode layer may be exposed, and the exposed semiconductor layer and electrode layer may be in contact with the contact electrodes CNE1 and CNE2. However, the present disclosure is not limited thereto, and at least a partial area of the insulating film 38 may be removed from the light-emitting element 30 such that side surfaces of both end portions of each of the semiconductor layer and the electrode layer may be partially exposed. The exposed side surfaces of each of the semiconductor layer and the electrode layer may be in direct contact with the contact electrodes CNE1 and CNE2.

A second insulating layer PAS2 may be partially disposed on the light-emitting element 30. For example, the second insulating layer PAS2 may be disposed on the light-emitting element 30 to have a width less than the length of the light-emitting element 30 so as to expose both end portions of the light-emitting element 30 while surrounding the light-emitting element 30. The second insulating layer PAS2 is disposed to cover the light-emitting element 30, the electrodes 21 and 22, and the first insulating layer PAS1 in a manufacturing process of the display device 10, and then may be removed to expose both end portions of the light-emitting element 30. In an embodiment, the second insulating layer PAS2 is disposed to extend in the second direction DR2 on the first insulating layer PAS1 in a plan view, thereby forming a linear or island-shaped pattern in each subpixel PXn. The second insulating layer PAS2 may protect the light-emitting element 30 and concurrently (e.g., simultaneously) fix the light-emitting element 30 in a manufacturing process of the display device 10.

The contact electrodes CNE1 and CNE2 and a third insulating layer PAS3 may be disposed on the second insulating layer PAS2.

The contact electrodes CNE1 and CNE2 may have a shape extending in a direction and may be disposed on the electrodes 21 and 22, respectively. The contact electrodes CNE1 and CNE2 may include a first contact electrode CNE1 disposed on the first electrode 21 and a second contact electrode CNE2 disposed on the second electrode 22. The contact electrodes CNE1 and CNE2 may be disposed to be spaced apart from each other and to face each other. For example, the first contact electrode CNE1 and the second contact electrode CNE2 may be disposed on the first electrode 21 and the second electrode 22, respectively, and spaced apart from each other in the first direction DR1. In an embodiment, each of the contact electrodes CNE1 and CNE2 may form a stripe pattern in the light-emitting area EMA of each subpixel PXn.

Each of the contact electrodes CNE1 and CNE2 may be in contact with the light-emitting elements 30. The first contact electrode CNE1 may be in contact with a first end portion of each of the light-emitting elements 30, and the second contact electrode CNE2 may be in contact with a second end portion of each of the light-emitting elements 30.

The semiconductor layer is exposed at both end surfaces of the light-emitting element 30 in the extending direction, and each of the contact electrodes CNE1 and CNE2 may be in contact with the exposed semiconductor layer of the light-emitting element 30 to be electrically connected to the light-emitting element 30. One side of each of the contact electrodes CNE1 and CNE2 in contact with both end portions of the light-emitting element 30 may be disposed on the second insulating layer PAS2. In addition, the first contact electrode CNE1 may be in contact with the first electrode 21 through the opening OP, which exposes a portion of an upper surface of the first electrode 21, and the second contact electrode CNE2 may be in contact with the second electrode 22 through the opening OP which exposes a portion of an upper surface of the second electrode 22.

A width of each of the contact electrodes CNE1 and CNE2 measured in a direction may be less than the width of each of the electrodes 21 and 22 measured in the direction. The contact electrodes CNE1 and CNE2 may be disposed to be in contact with the first end portion and the second end portion of the light-emitting element 30, respectively, and concurrently (e.g., simultaneously), to cover a portion of the upper surface of each of the first electrode 21 and the second electrode 22. However, the present disclosure is not limited thereto, and the contact electrodes CNE1 and CNE2 may be formed to have a width greater than that of each of the electrodes 21 and 22 to cover both sides of each of the electrodes 21 and 22.

The contact electrodes CNE1 and CNE2 may include a transparent conductive material. For example, the contact electrodes CNE1 and CNE2 may include ITO, IZO, ITZO, aluminum (Al), or the like. Light emitted from the light-emitting element 30 may pass through the contact electrodes CNE1 and CNE2 and travel toward the electrodes 21 and 22. However, the present disclosure is not limited thereto.

In the drawings, it is illustrated that two contact electrodes CNE1 and CNE2 are disposed in one subpixel PXn, but the present disclosure is not limited thereto. The number of contact electrodes CNE1 and CNE2 may vary depending on the number of the electrodes 21 and 22 disposed for each subpixel PXn.

The third insulating layer PAS3 is disposed to cover the first contact electrode CNE1. The third insulating layer PAS3 may be disposed to cover a side including the first contact electrode CNE1, on which the first contact electrode CNE1 is disposed, on the basis of the second insulating layer PAS2. For example, the third insulating layer PAS3 may be disposed to cover the first contact electrode CNE1 and the first insulating layer PAS1 that is disposed on the first electrode 21. In an embodiment, such an arrangement may be formed by a process of partially removing an insulating material layer forming the third insulating layer PAS3 in order to form the second contact electrode CNE2, after the insulating material layer is disposed entirely on the light-emitting area EMA. In the above process, the insulating material layer forming the third insulating layer PAS3 may be removed together with an insulating material layer forming the second insulating layer PAS2, and one side of the third insulating layer PAS3 may be aligned with one side of the second insulating layer PAS2. One side of the second contact electrode CNE2 may be disposed on the third insulating layer PAS3, and the second contact electrode CNE2 may be insulated from the first contact electrode CNE1 with the third insulating layer PAS3 therebetween.

In an embodiment, a fourth insulating layer PAS4 may be disposed entirely in the display area DPA of the substrate 11. The fourth insulating layer PAS4 may protect members disposed on the substrate 11 from an external environment. However, the fourth insulating layer PAS4 may be omitted.

Each of the first insulating layer PAS1, the second insulating layer PAS2, the third insulating layer PAS3, and the fourth insulating layer PAS4, which are described above, may include an inorganic insulating material or an organic insulating material. For example, the first insulating layer PAS1, the second insulating layer PAS2, the third insulating layer PAS3, and the fourth insulating layer PAS4 may each include an inorganic insulating material, such as silicon oxide ($SiO_x$), silicon nitride ($SiN_x$), silicon oxynitride ($SiOxN_y$), aluminum oxide ($Al_2O_3$), aluminum nitride (AlN), or the like. In another embodiment, the first insulating layer PAS1, the second insulating layer PAS2, the third insulating layer PAS3, and the fourth insulating layer PAS4 may each include an organic insulating material, such as an acrylic resin, an epoxy resin, a phenol resin, a polyamide resin, a PI resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the present disclosure is not limited thereto.

Figure 4:
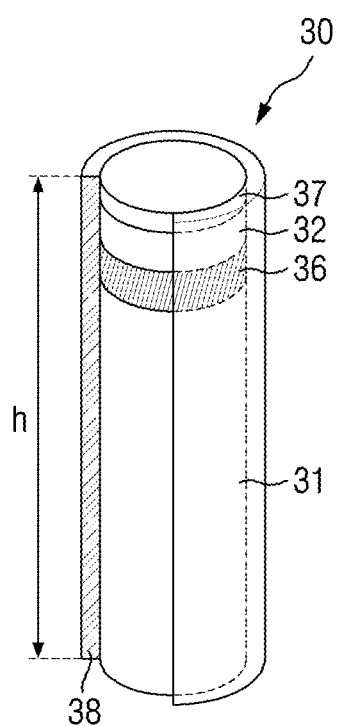
FIG. 4 is a perspective view illustrating a light-emitting element according to an embodiment.

FIG. 4 is a perspective view illustrating a light-emitting element according to an embodiment.

Referring to FIG. 4, the light-emitting element 30 may be a light-emitting diode, and, in an embodiment, may be an inorganic light-emitting diode having a size in micrometer or nanometer scale and made of an inorganic material. The inorganic light-emitting diode may be aligned between two electrodes 21 and 22 (see FIG. 3) in which polarity is formed by forming an electric field in a certain, or specific, direction between the two electrodes 21 and 22 (see FIG. 3) facing each other. The light-emitting elements 30 may be aligned between the electrodes by the electric field formed on the two electrodes 21 and 22 (see FIG. 3).

The light-emitting element 30 according to an embodiment may have a shape extending in a direction. The light-emitting element 30 may have a shape such as a cylinder, a rod, a wire, or a tube. However, the shape of the light-emitting element 30 is not limited thereto, and the light-emitting element 30 may have a shape of a cube, a rectangular parallelepiped, a polygonal pillar, such as a hexagonal pillar, or the like, or have a shape which extends in a direction and has a partially inclined outer surface. Thus, the light-emitting element 30 may have various shapes. A plurality of semiconductors included in the light-emitting element 30, which will be described below, may have a structure in which the semiconductors are sequentially arranged or stacked in the direction.

The light-emitting element 30 may include a semiconductor layer doped with an arbitrary conductive-type (for example, p-type or n-type) impurity. The semiconductor layer may emit light at a certain, or specific, wavelength band by receiving an electrical signal applied from an external power source.

As shown in FIG. 4, the light-emitting element 30 may include a first semiconductor layer 31, a second semiconductor layer 32, the light-emitting layer 36, an electrode layer 37, and the insulating film 38.

In an embodiment, the first semiconductor layer 31 may be an n-type semiconductor. When the light-emitting element 30 emits light in a blue wavelength band, the first semiconductor layer 31 may include a semiconductor material having a composition ratio of $Al_xGa_yIn_{(1-x-y)}N$ (where, $0 \leq x \leq 1$, $0 \leq y \leq 1$, and $0 \leq x+y \leq 1$). For example, the semiconductor material may be one or more among AlGaInN, GaN, AlGaN, InGaN, AlN, and InN that are doped with an n-type impurity. In an embodiment, the first semiconductor layer 31 may be doped with an n-type dopant, and the n-type dopant may be Si, Ge, Sn, or the like. For example, the first semiconductor layer 31 may be n-GaN doped with Si which is an n-type dopant. The first semiconductor layer 31 may have a length in a range from 1.5 μm to 5 μm, but the present disclosure is not limited thereto.

The second semiconductor layer 32 is disposed on the light-emitting layer 36 to be described below. In an embodiment, the second semiconductor layer 32 may be a p-type semiconductor, and when the light-emitting element 30 emits light in a blue or green wavelength band, the second semiconductor layer 32 may include a semiconductor material having a composition ratio of $Al_xGa_yIn_{(1-x-y)}N$ (where, $0 \leq x \leq 1$, $0 \leq y \leq 1$, and $0 \leq x+y \leq 1$. For example, the semiconductor material may be one or more among AlGaInN, GaN, AlGaN, InGaN, AlN, and InN that are doped with a p-type impurity. In an embodiment, the second semiconductor layer 32 may be doped with a p-type dopant, and the p-type dopant may be Mg, Zn, Ca, Se, Ba, or the like. For example, the second semiconductor layer 32 may be p-GaN doped with Mg which is a p-type dopant. The second semiconductor layer 32 may have a length in a range from 0.05 μm to 0.10 μm, but the present disclosure is not limited thereto.

In the drawing, the first semiconductor layer 31 and the second semiconductor layer 32 are illustrated as being formed as one layer, but the present disclosure is not limited thereto. The first semiconductor layer 31 and the second semiconductor layer 32 may further include a larger number of layers, for example, a clad layer or a tensile strain barrier reducing (TSBR) layer according to a material of the light-emitting layer 36.

The light-emitting layer 36 is disposed between the first semiconductor layer 31 and the second semiconductor layer 32. The light-emitting layer 36 may include a material having a single or multi-quantum well structure. In an embodiment, when the light-emitting layer 36 includes a material having a multi-quantum well structure, the light-emitting layer 36 may have a structure in which a plurality of quantum layers and a plurality of well layers are alternately stacked. The light-emitting layer 36 may emit light due to a combination of electron-hole pairs in response to electrical signals applied through the first semiconductor layer 31 and the second semiconductor layer 32. When the light-emitting layer 36 emits light in a blue wavelength band, the light-emitting layer 36 may include a material such as AlGaN, AlGaInN, or the like. In particular, when the light-emitting layer 36 has a multiple quantum well structure in which quantum layers and well layers are alternately stacked, the quantum layer may include a material such as AlGaN or AlGaInN, and the well layer may include a material such as GaN or AlInN. For example, the light-emitting layer 36 may include AlGaInN as a quantum layer and AlInN as a well layer. In an embodiment, as described above, the light-emitting layer 36 may emit blue light having a central wavelength range from 450 nm to 495 nm.

However, the present disclosure is not limited thereto, and the light-emitting layer 36 may have a structure in which semiconductor materials having large bandgap energy and semiconductor materials having small bandgap energy are alternately stacked or include other group III or group V semiconductor materials according to a wavelength band of emitted light. The light emitted by the light-emitting layer 36 is not limited to light in the blue wavelength band, and the light-emitting layer 36 may also emit light in a red or green wavelength band in some cases. The light-emitting layer 36 may have a length in a range from 0.05 μm to 0.10 μm, but the present disclosure is not limited thereto.

In an embodiment, the light emitted from the light-emitting layer 36 may be emitted to not only an outer surface of the light-emitting element 30 in a length direction but also both side surfaces of the light-emitting element 30. Directivity of the light emitted from the light-emitting layer 36 is not limited to one direction.

In an embodiment, the electrode layer 37 may be an ohmic contact electrode. However, the present disclosure is not limited thereto, and, in an embodiment, the electrode layer 37 may be a Schottky contact electrode. The light-emitting element 30 may include at least one electrode layer 37. Although the light-emitting element 30 is illustrated in FIG. 4 as including one electrode layer 37, the present disclosure is not limited thereto. In some cases, the light-emitting element 30 may include a larger number of electrode layers 37, or the electrode layer 37 may be omitted. In addition, in FIG. 4, the electrode layer 37 is illustrated as being disposed on a side of the second semiconductor layer 32, but the present disclosure is not limited thereto. In some cases, the electrode layer 37 may be disposed on a side of the first semiconductor layer 31, or may be disposed on a side of each of the first semiconductor layer 31 and the second semiconductor layer 32.

In the display device 10 according to an embodiment, when the light-emitting element 30 is electrically connected to the electrode or the contact electrode, the electrode layer 37 may decrease the resistance between the light-emitting element 30 and the electrode or between the light-emitting element 30 and the contact electrode. The electrode layer 37 may include a conductive metal. For example, the electrode layer 37 may include at least one among aluminum (Al), titanium (Ti), indium (In), gold (Au), silver (Ag), indium tin oxide (ITO), indium zinc oxide (IZO), and indium tin-zinc oxide (ITZO). Further, the electrode layer 37 may include a semiconductor material doped with an n-type or p-type impurity. The electrode layer 37 may include the same material or different materials, but the present disclosure is not limited thereto.

The insulating film 38 may be disposed to surround outer surfaces of the plurality of semiconductor layers and the electrode layers, which are described above. For example, the insulating film 38 may be disposed to surround at least the outer surface of the light-emitting layer 36 and may extend in a direction in which the light-emitting element 30 extends. The insulating film 38 may protect the members. The insulating film 38 may be formed to surround side surface portions of the members and to expose both end portions of the light-emitting element 30 in the length direction.

In the drawing, the insulating film 38 is illustrated as being formed to extend in the length direction of the light-emitting element 30 to cover from the first semiconductor layer 31 to a side surface of the electrode layer 37, but the present disclosure is not limited thereto. Since the insulating film 38 covers only the outer surfaces of some semiconductor layers including the light-emitting layer 36 or covers only a portion of the outer surface of the electrode layer 37, the outer surface of the electrode layer 37 may be partially exposed. In an embodiment, an upper surface of the insulating film 38 may be formed to be rounded in a cross-section in an area adjacent to at least one end portion of the light-emitting element 30.

The insulating film 38 may have a thickness in a range from 10 nm to 1.0 μm, but the present disclosure is not limited thereto. In an embodiment, the insulating film 38 may have a thickness of about 40 nm.

The insulating film 38 may include at least one selected from among materials having insulating properties, for example, silicon oxide ($SiO_x$), silicon nitride ($SiN_x$), silicon oxynitride ($SiO_xN_y$), aluminum nitride (AlN), and aluminum oxide ($Al_2O_3$). Accordingly, it is possible to prevent or substantially prevent an electrical short circuit which may occur when the light-emitting layer 36 is in direct contact with an electrode through which an electrical signal is transmitted to the light-emitting element 30. Further, since the insulating film 38 protects the outer surface of the light-emitting element 30 and the light-emitting layer 36, it is possible to prevent or substantially prevent degradation in light emission efficiency.

In an embodiment, an outer surface of the insulating film 38 may be surface-treated. In an embodiment, the light-emitting elements 30 may be aligned by being sprayed on electrodes in a state of being dispersed in an ink (e.g., a predetermined ink). Here, in order to allow the light-emitting element 30 to maintain the dispersed state in the ink without being agglomerated with another adjacent light-emitting element 30, the surface of the insulating film 38 may be hydrophobically or hydrophilically treated. For example, the outer surface of the insulating film 38 may be surface-treated with a material such as stearic acid or 2,3-naphthalene dicarboxylic acid.

Herein, a manufacturing process of the light-emitting elements 30 according to an embodiment will be described.

Figure 5:
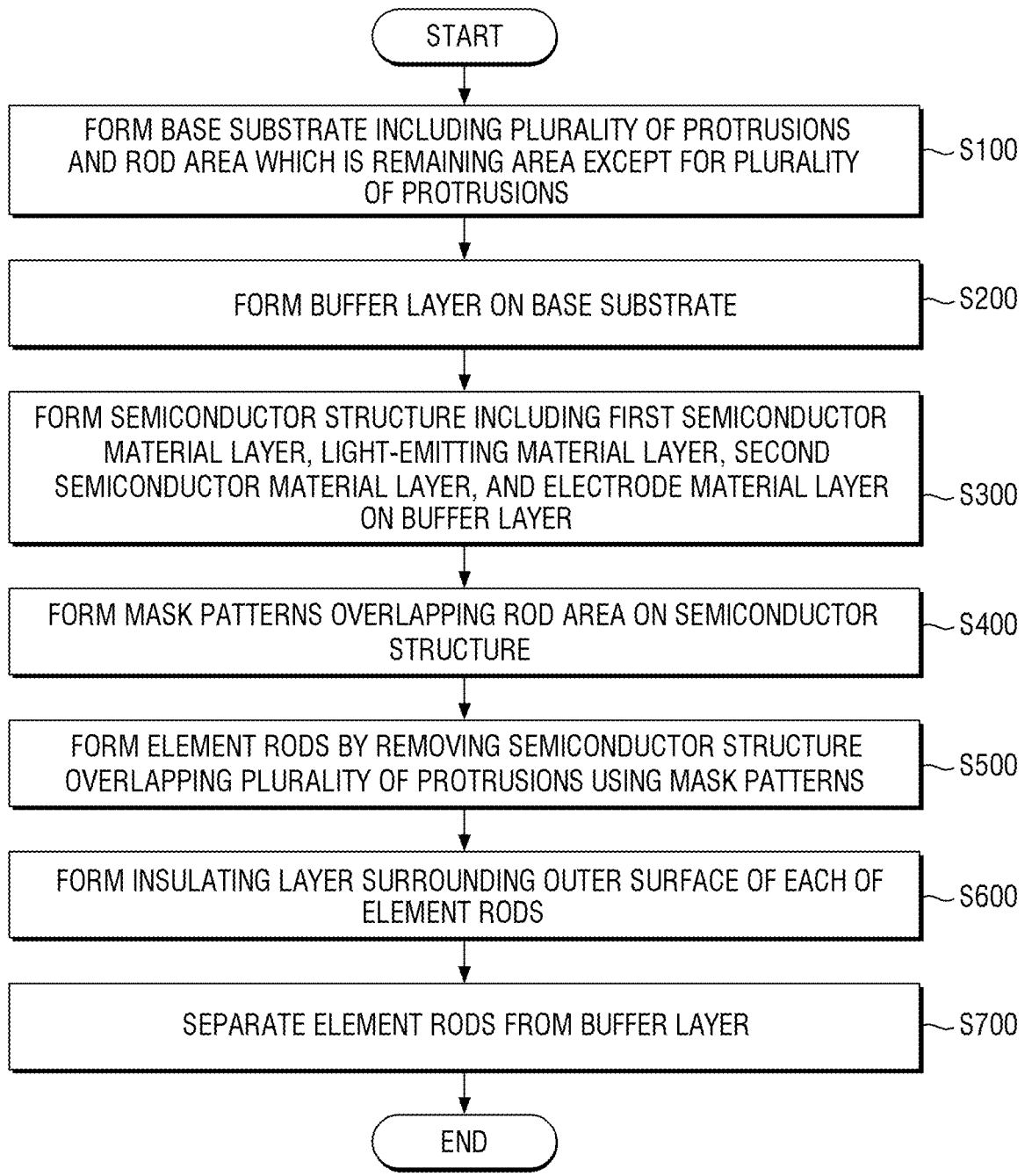
FIG. 5 is a flowchart illustrating a method of manufacturing a light-emitting element according to an embodiment.

FIG. 5 is a flowchart illustrating a method of manufacturing the light-emitting elements according to an embodiment.

Referring to FIG. 5, a method of manufacturing the light-emitting elements 30 according to an embodiment may include forming a base substrate including a plurality of protrusions and a rod area which is a remaining area except for the plurality of protrusions (S100), forming a buffer layer on the base substrate (S200), forming a semiconductor structure including a first semiconductor material layer, a light-emitting material layer, a second semiconductor material layer, and an electrode material layer on the buffer layer (S300), forming mask patterns overlapping the rod area on the semiconductor structure (S400), forming element rods by removing the semiconductor structure overlapping the plurality of protrusions using the mask patterns (S500), forming an insulating layer surrounding an outer surface of each of the element rods (S600), and separating the element rods from the buffer layer (S700).

The light-emitting elements 30 according to an embodiment may be manufactured from semiconductor rods grown in the rod area of the base substrate, which does not overlap the plurality of protrusions. Herein, the method of manufacturing the light-emitting elements 30 will be described in further detail with further reference to other drawings.

FIGS. 6 to 15 are views illustrating a manufacturing process of the light-emitting elements according to an embodiment. Herein, the manufacturing process of the light-emitting elements will be described in conjunction with FIG. 5.

Figure 6:
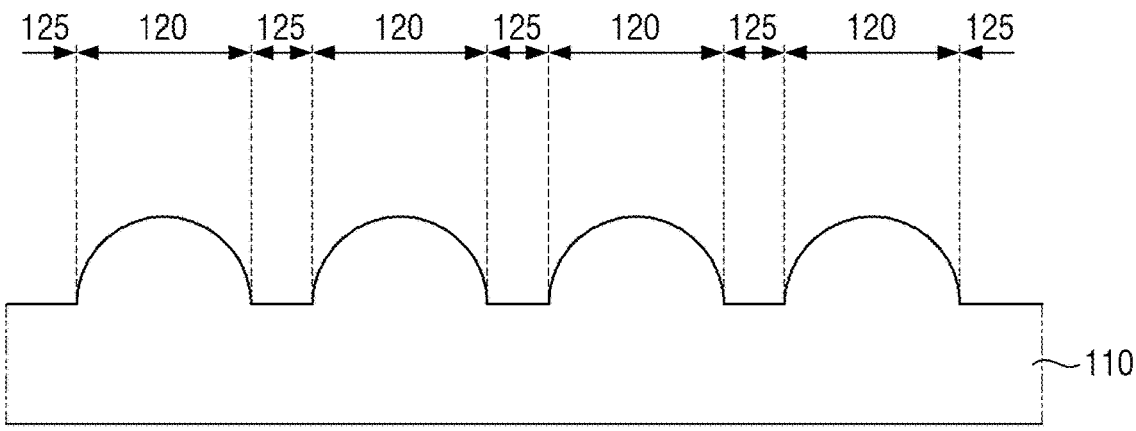
FIGS. 6 to 15 are views illustrating a manufacturing process of a light-emitting element according to an embodiment.
Figure 7:
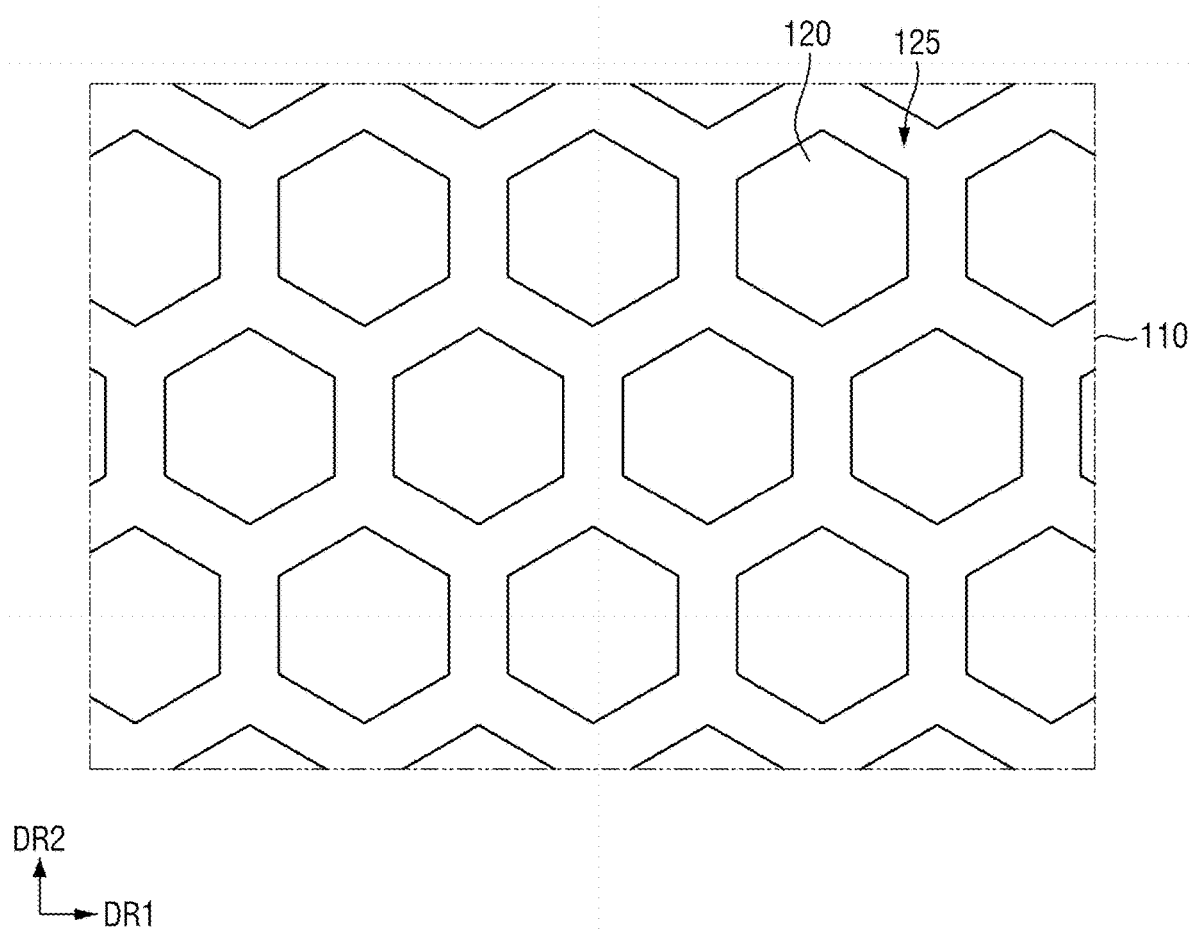

First, referring to FIGS. 6 and 7, a base substrate 110 including a plurality of protrusions 120 and a rod area 125, which is a remaining area except for the plurality of protrusions 120, is formed (S100). In an embodiment, the base substrate 110 may include a transparent substrate, such as a sapphire (Al2O3) substrate and a glass substrate. However, the present disclosure is not limited thereto, and the base substrate 110 may be formed as a conductive substrate, such as a GaN, SiC, ZnO, Si, GaP, or GaAs substrate. Herein, a case in which the base substrate 110 is a sapphire ($Al_2O_3$) substrate will be described as an example. A thickness of the base substrate 110 is not particularly limited, but, as an example, the base substrate 110 may have a thickness in a range from 400 µm to 1500 µm.

In an embodiment, the plurality of protrusions 120 may be manufactured by a process of etching the base substrate 110. For example, the plurality of protrusions 120 may be manufactured by forming a mask pattern on the base substrate 110 and etching a portion of the base substrate 110. The mask pattern may be a photoresist, but the present disclosure is not limited thereto.

The plurality of protrusions 120 may be disposed to be spaced apart from each other, and, for example, may be disposed in a dot type. The rod area 125 may be an area that does not overlap the plurality of protrusions 120. In FIG. 7, when the plurality of protrusions 120 are disposed to be spaced apart by an interval (e.g., a predetermined interval), the rod area 125 may be an area between the plurality of protrusions 120. In an embodiment, the rod area 125 may be formed in a mesh type.

As shown in FIG. 7, the plurality of protrusions 120 may be repeatedly disposed at an interval (e.g., a predetermined interval) in the first direction DR1, and may be repeatedly disposed at an interval (e.g., a predetermined interval) in the second direction DR2. The plurality of protrusions 120 may concentrate threading dislocations (dislocation defects) generated due to lattice constant mismatch of GaN layers (e.g., semiconductor structures) formed on the base substrate 110 and the base substrate 110. Specifically, the threading dislocations may be formed at a high density at a peak disposed at an uppermost end of each of the plurality of protrusions 120, and the threading dislocations may be formed at a relatively low density at the other area of each of the plurality of protrusions 120. By forming the plurality of protrusions 120 in view of this, it is possible to concentrate threading dislocations in the area overlapping the plurality of protrusions 120 and minimize or reduce threading dislocations generated in the rod area 125, which is the remaining area not overlapping the plurality of protrusions 120. Accordingly, threading dislocations of the element rod partially formed on the base substrate 110 may be reduced.

In an embodiment, the plurality of protrusions 120 may each have a hexagonal pyramid shape of which a planar shape is a hexagonal shape. However, the present disclosure is not limited thereto, and the plurality of protrusions 120 may each have a pyramid shape having a polygonal planar shape, such as a circular shape or a quadrangular shape. In an embodiment, when the planar shape of each of the plurality of protrusions 120 is formed in a hexagonal shape, the plurality of protrusions 120 may be arranged in a honeycomb shape.

Figure 8:
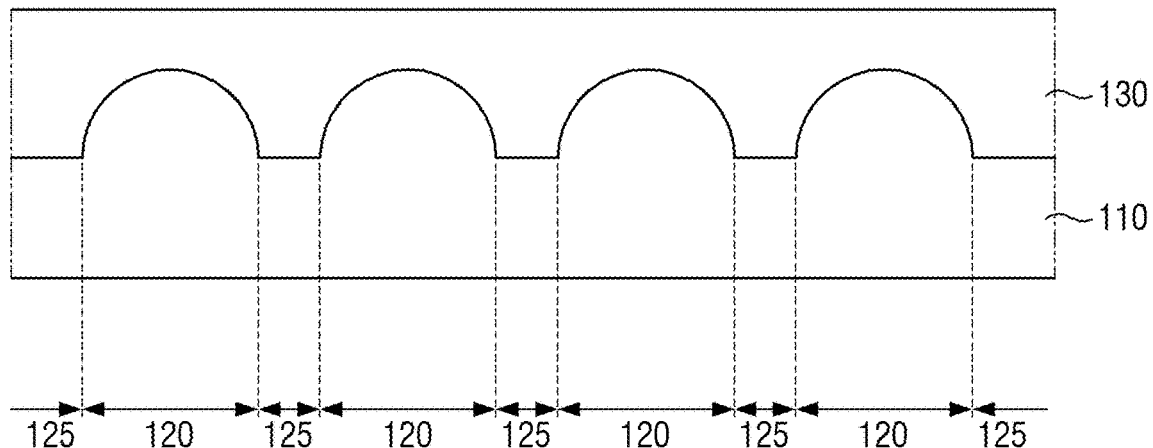

Next, referring to FIG. 8, a buffer layer 130 is formed on the base substrate 110 (S200). In the drawing, one buffer layer 130 is illustrated as being stacked, but the present disclosure is not limited thereto, and a plurality of buffer layers may be formed. The buffer layer 130 may be disposed to reduce a lattice constant difference between the first semiconductor material layer and the base substrate 110, which will be described below.

As an example, the buffer layer 130 may include an undoped semiconductor. In an embodiment, the buffer layer 130 may include substantially a same material as the first semiconductor material layer and may include a material that is not n-type or p-type doped. In an embodiment, the buffer layer 130 may include at least one selected from among undoped InAlGaN, GaN, AlGaN, InGaN, AlN, and InN, but the present disclosure is not limited thereto. In an embodiment, the buffer layer 130 may be omitted, depending on the base substrate 110. Herein, a case in which the buffer layer 130 including an undoped semiconductor is formed on the base substrate 110 will be described as an example.

Figure 9:
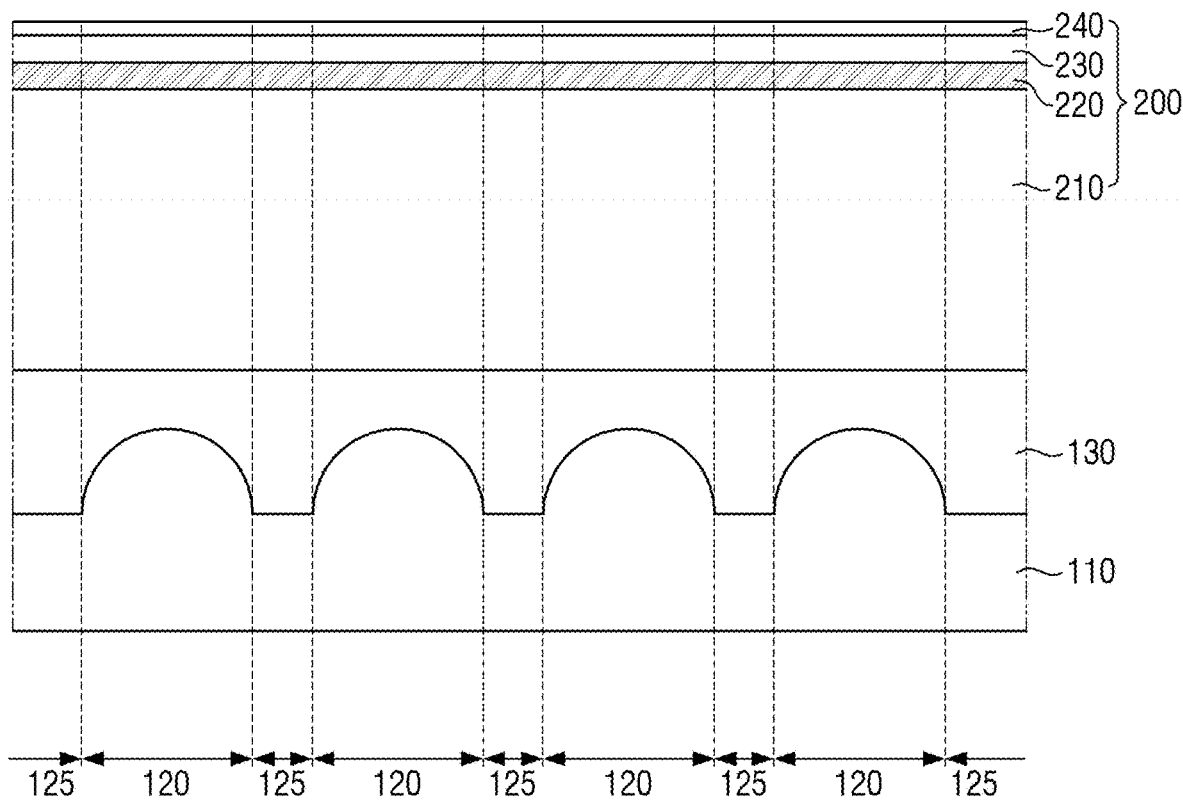

Next, referring to FIG. 9, a semiconductor structure 200 including a first semiconductor material layer 210, a light-emitting material layer 220, a second semiconductor material layer 230, and an electrode material layer 240 is formed on the buffer layer 130 (S300). The semiconductor structure 200 may include the first semiconductor material layer 210, the light-emitting material layer 220 disposed on the first semiconductor material layer 210, the second semiconductor material layer 230 disposed on the light-emitting material layer 220, and the electrode material layer 240 disposed on the second semiconductor material layer 230. The plurality of material layers included in the semiconductor structure 200 may be formed by performing typical processes as described above, and the plurality of material layers included in the semiconductor structure 200 may correspond to the respective layers included in the light-emitting element 30 according to an embodiment. That is, the first semiconductor material layer 210, the light-emitting material layer 220, the second semiconductor material layer 230, and the electrode material layer 240 may include the same materials as the first semiconductor layer 31, the light-emitting layer 36, the second semiconductor layer 32, and the electrode layer 37 of the light-emitting element 30, respectively.

Figure 10:
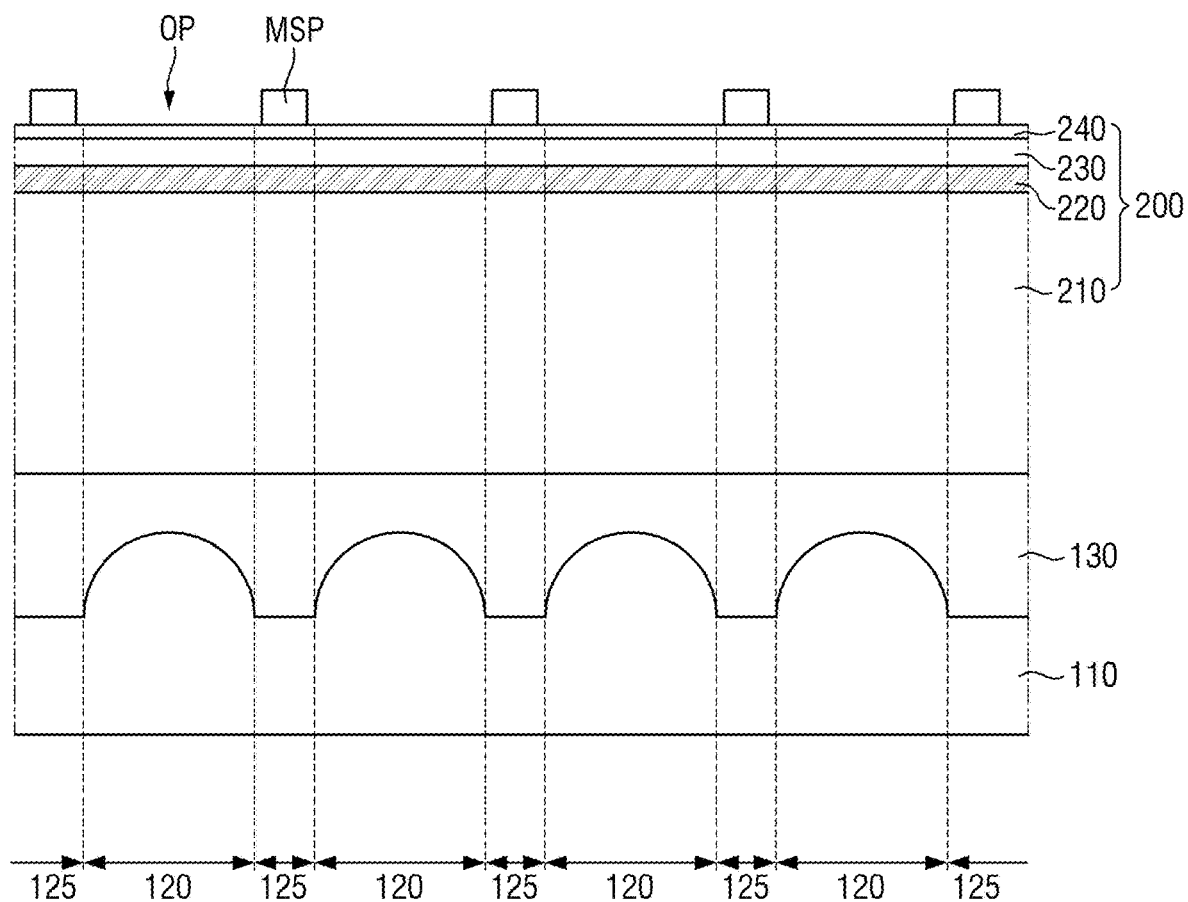
Figure 11:
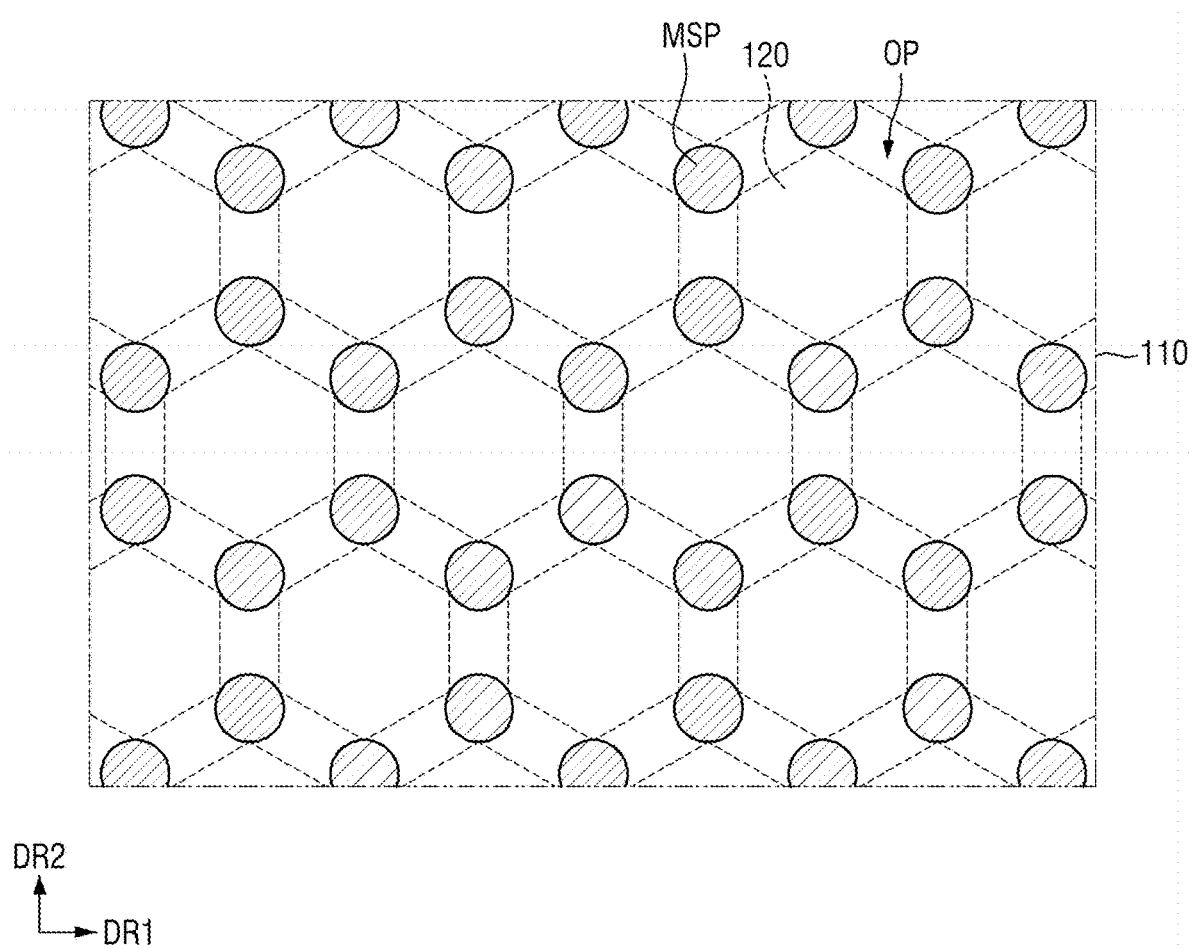

Subsequently, referring to FIGS. 10 and 11, a plurality of mask patterns MSP overlapping the rod area 125 are formed on the semiconductor structure 200 (S400). In an embodiment, a photoresist is coated on the base substrate 110 on which the semiconductor structure 200 is formed, and exposed and developed to form the plurality of mask patterns MSP. The plurality of mask patterns MSP may be disposed to overlap the rod area 125 of the base substrate 110. The planar shape of each of plurality of mask patterns MSP may be formed in a circular shape, but is not limited thereto, and may vary depending on the shape of the light-emitting element.

In an embodiment, the plurality of mask patterns MSP do not overlap the plurality of protrusions 120 formed on the base substrate 110, and may be disposed between the plurality of protrusions 120, respectively. In an embodiment, each of the plurality of mask patterns MSP may be disposed adjacent to a vertex of each of the protrusions 120 to be similar to the planar shape of each of the protrusions 120. For example, as shown in FIG. 11, in an embodiment, the plurality of mask patterns MSP are disposed adjacent to six vertices of the hexagonal-shaped protrusions 120, such that a line connecting a center of each of the plurality of mask patterns MSP may form a hexagonal shape. When the plurality of mask patterns MSP are arranged in a hexagonal shape, the number of mask patterns MSP may be increased, such as to the maximum, while securing a pattern margin of the mask patterns MSP. The semiconductor structure 200 at the area overlapping the mask pattern MSP is formed as the light-emitting element in a subsequent process, such that a maximum number of light-emitting elements may be secured on the limited base substrate 110. However, the present disclosure is not limited thereto, and the plurality of mask patterns MSP may be disposed regardless of the planar shape of each of the protrusions 120 as long as the plurality of mask patterns MSP are disposed in the rod area 125 of the base substrate 110, which does not overlap the plurality of protrusions 120.

Openings OP may be disposed in most of the base substrate 110 on which the semiconductor structure 200 is formed. The openings OP may be areas that expose the electrode material layer 240 of the semiconductor structure 200 below the openings OP. The openings OP may be disposed to overlap the plurality of protrusions 120 of the base substrate 110, respectively, and overlap a portion of the rod area 125.

Figure 12:
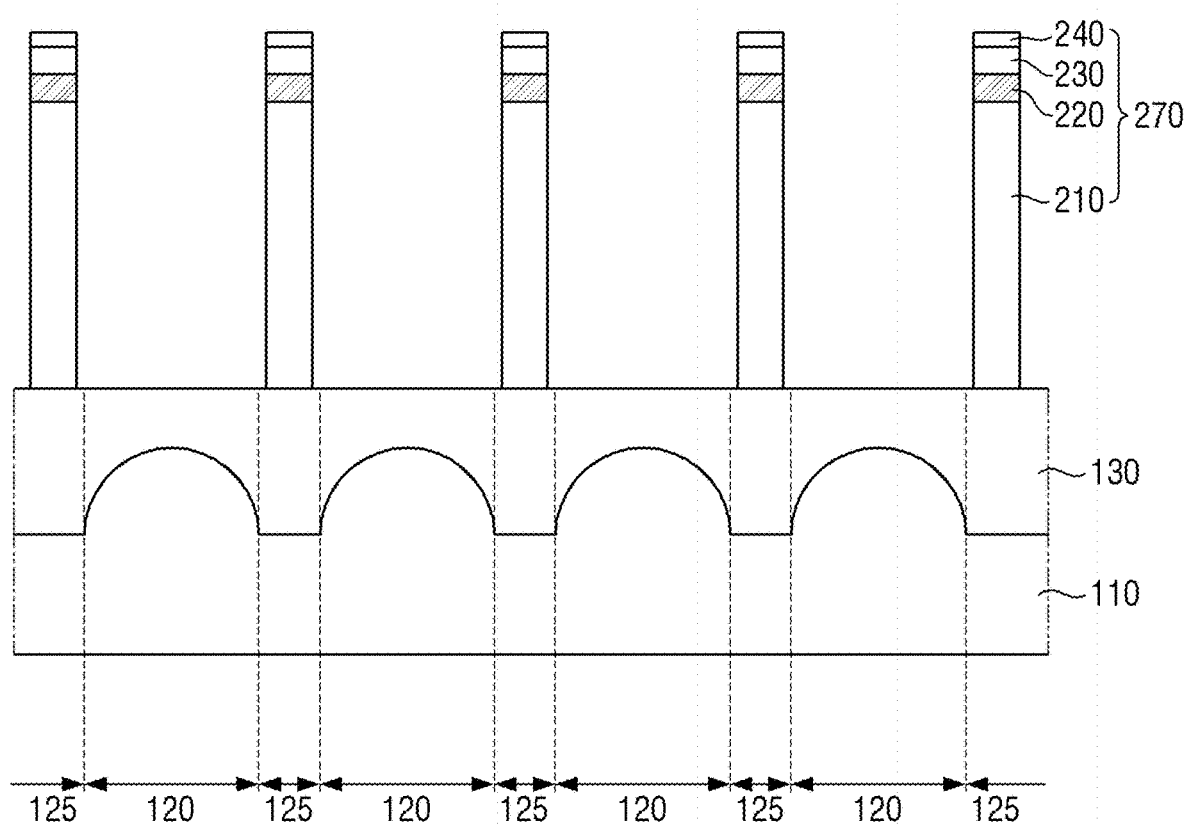

Next, referring to FIG. 12, element rods 270 are formed by removing the semiconductor structure 200 overlapping the plurality of protrusions 120 and a portion of the rod area 125 using the mask patterns MSP (S500).

The semiconductor structure 200 may be etched by a typical method. For example, the semiconductor structure 200 may be etched by a method of etching the semiconductor structure 200 in a direction perpendicular to the base substrate 110 therebelow along the mask patterns MSP.

For example, the etching process of the semiconductor structure 200 may be performed through a dry etching method, a wet etching method, a reactive ion etching (RIE) method, an inductively coupled plasma reactive ion etching (ICP-RIE) method, or the like. In the case of dry etching, anisotropic etching is possible, and, thus, the dry etching method may be suitable for vertical etching. When the above-described etching method is used, an etchant may be $Cl_2$, $O_2$, or the like. However, the present disclosure is not limited thereto. In some embodiments, the semiconductor structure 200 may be etched through a combination of a dry etching method and a wet etching method. For example, etching may be first performed in a depth direction through the dry etching method, and then the etched sidewall may be placed on a planar surface perpendicular to a surface by performing the wet etching method which is an isotropic etching method.

In an embodiment, in the process of removing the semiconductor structure 200, the buffer layer 130 therebelow is not etched. In an embodiment, the mask patterns MSP remaining on the element rods 270 are removed by stripping. Thus, the element rods 270 may be formed to overlap the rod area 125 of the base substrate 110.

Figure 13:
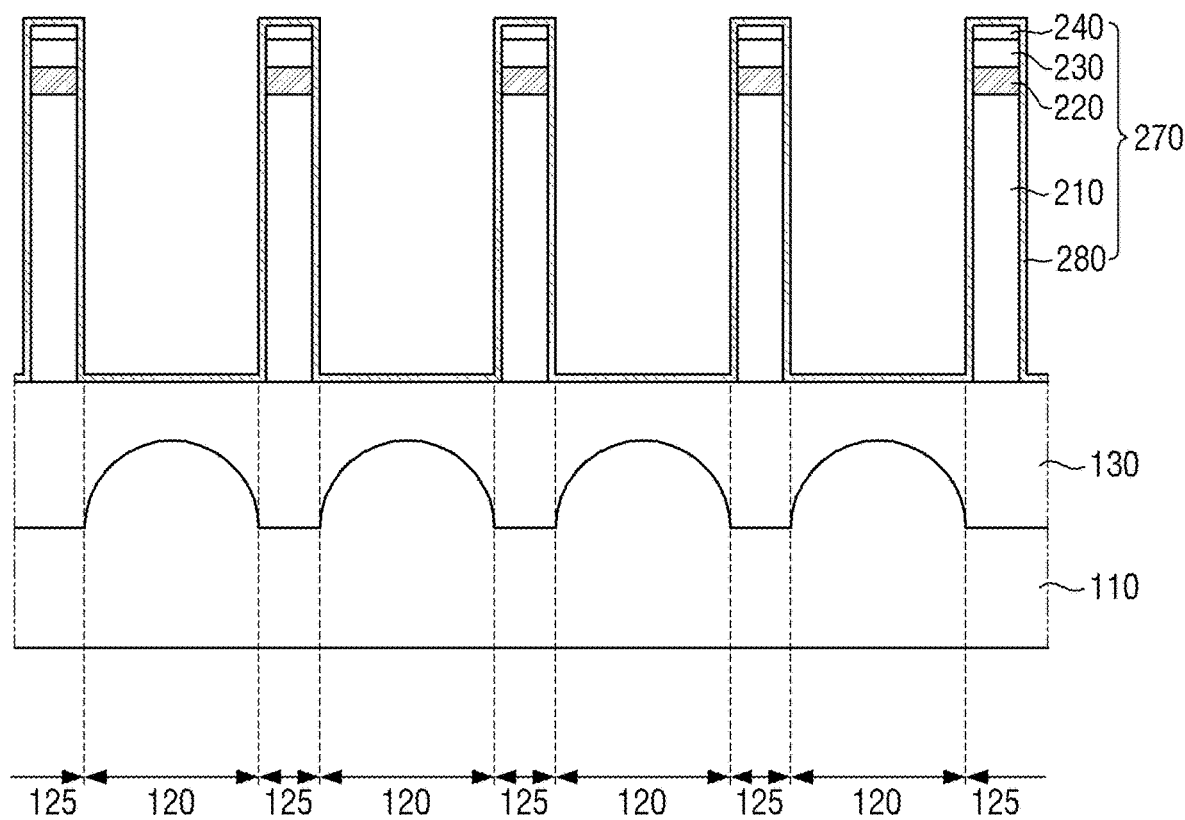

Next, referring to FIG. 13, an insulating film 290 surrounding an outer surface of each of the element rods 270 is formed (S600).

An insulating material layer 280 surrounding the outer surface of each of the element rods 270, which are formed to be spaced apart from each other, is formed on the base substrate 110. The insulating material layer 280 may be partially etched in a subsequent process to form the insulating film 290. The insulating material layer 280 may be disposed to surround an upper surface of the buffer layer 130 and the outer surface of each of the element rods 270. Accordingly, the insulating material layer 280 may be disposed to surround an outer surface of each of the first semiconductor material layer 210, the light-emitting material layer 220, the second semiconductor material layer 230, and the electrode material layer 240 of the element rod 270.

The insulating material layer 280 may be formed by a method of applying or immersing an insulating material on the outer surfaces of the vertically etched element rods 270, but the present disclosure is not limited thereto. In an embodiment, the insulating material layer 280 may be formed through an atomic layer deposition (ALD) method. In an embodiment, the insulating material layer 280 may be made of one selected from among silicon oxide ($SiO_x$), silicon nitride (SiN$_x$), silicon oxynitride (SiO$_x$N$_y$), aluminum oxide (Al$_2$O$_3$), aluminum nitride (AlN), and the like.

Subsequently, referring to FIG. 14, the insulating film 290 is formed by partially removing the insulating material layer 280. The process of etching the insulating material layer 280 may be performed over the entire surface of the base substrate 110. Accordingly, some of the insulating material layer 280, which is disposed on an upper surface of each of the element rods 270 and an area in which the element rods 270 are spaced apart from each other, may be etched to be removed. In an embodiment, the etching process of partially removing the insulating material layer 280 may be performed by a process of dry etching, etchback, or the like, which is anisotropic etching. The insulating material layer 280 may be partially removed by the etching process, and an upper surface of the electrode material layer 240 and a portion of the buffer layer 130 may be exposed. Thus, the insulating material layer 280 may be formed as the insulating film 290.

Figure 15:
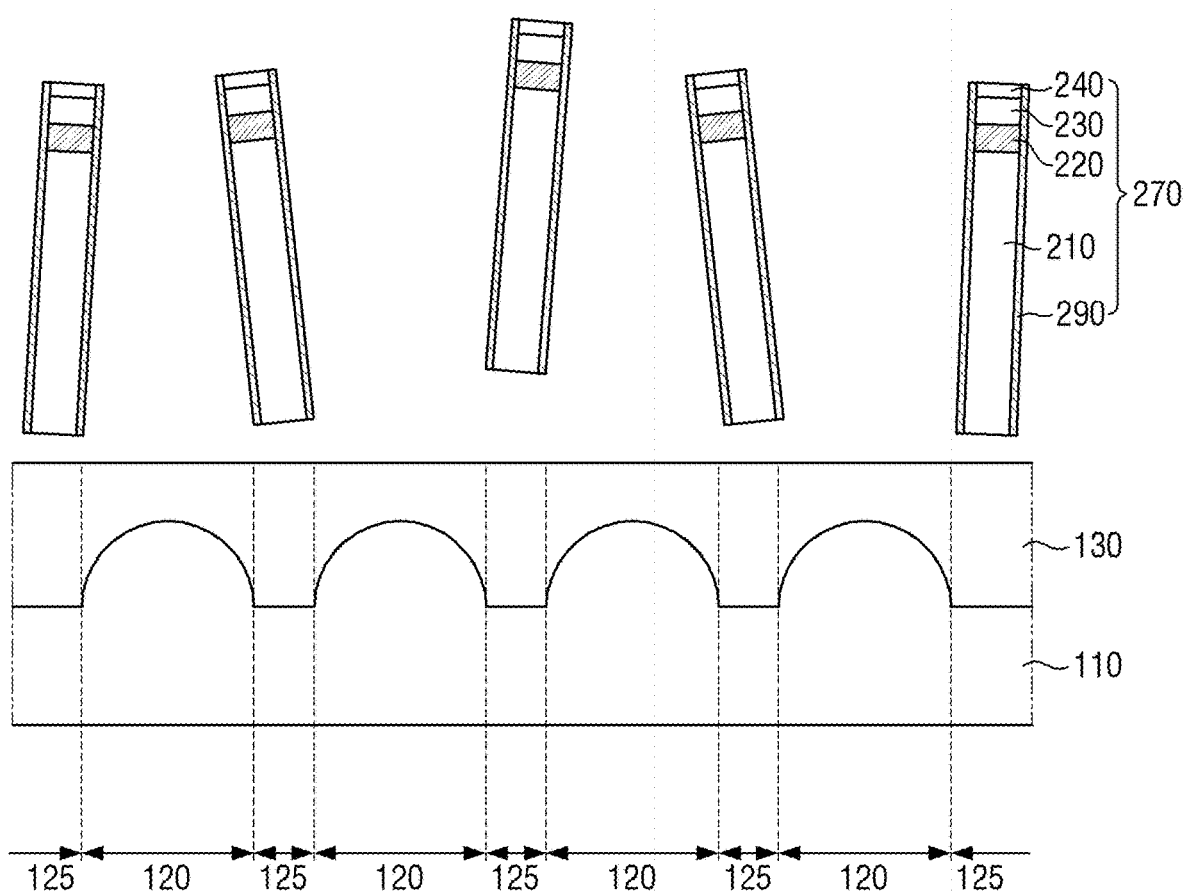

Lastly, as shown in FIG. 15, the element rods 270 are separated from the buffer layer 130 (S700). The element rods 270 on which the insulating film 290 is formed may be separated from the base substrate 110 on which the buffer layer 130 is formed to be manufactured as the light-emitting elements 30.

The light-emitting elements 30 according to an embodiment may be manufactured through the above-described processes. The light-emitting elements 30 manufactured in this way are disposed between the first electrode 21 and the second electrode 22 to manufacture the display device 10.

In the above-described method of manufacturing the light-emitting element according to an embodiment, the semiconductor structure 200, which is grown on the rod area 125 not overlapping the plurality of protrusions 120, may be manufactured as the light-emitting elements 30. Since the density of threading dislocations is very high at the area overlapping the plurality of protrusions 120, in particular, at peaks of the plurality of protrusions 120, the light-emitting elements 30 may be manufactured in the rod area 125 in which the density of the threading dislocations is relatively low. Accordingly, the threading dislocations of the manufactured light-emitting elements 30 may be minimized or reduced, such that emission defects and leakage current of the light-emitting element 30 may be reduced, thereby improving light emission efficiency.

In a method of manufacturing the light-emitting elements 30 according to another embodiment, the element rods 270 may at least partially overlap the plurality of protrusions 120 formed on the base substrate 110. Herein, the method of manufacturing the light-emitting elements 30 according to another embodiment will be described with reference to other drawings. In the following, descriptions of the processes that are the same as those described with reference to FIGS. 6 to 15 will be omitted, and only processes with differences may be illustrated and described.

Figure 16:
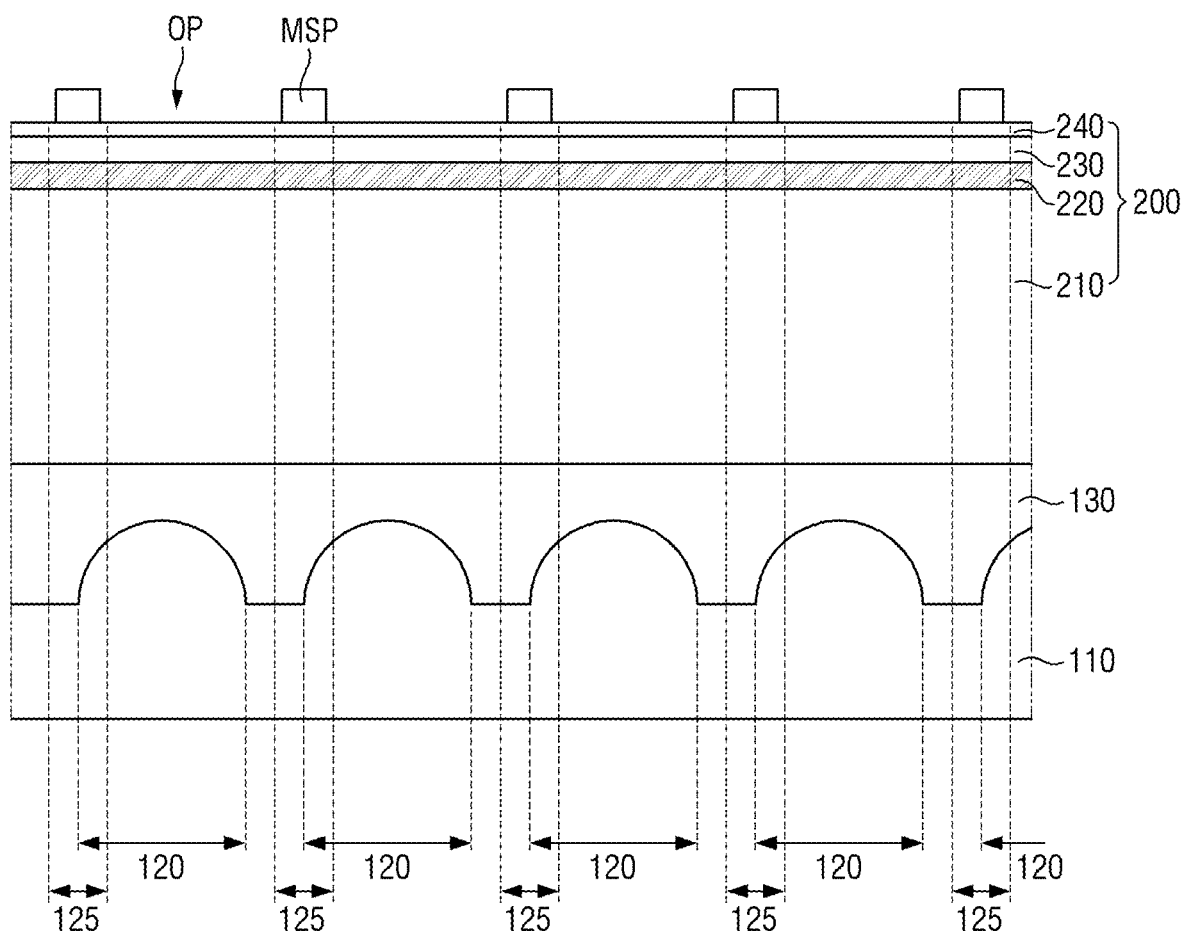
FIG. 16 is a cross-sectional view illustrating a manufacturing process of a light-emitting element according to another embodiment.
Figure 17:
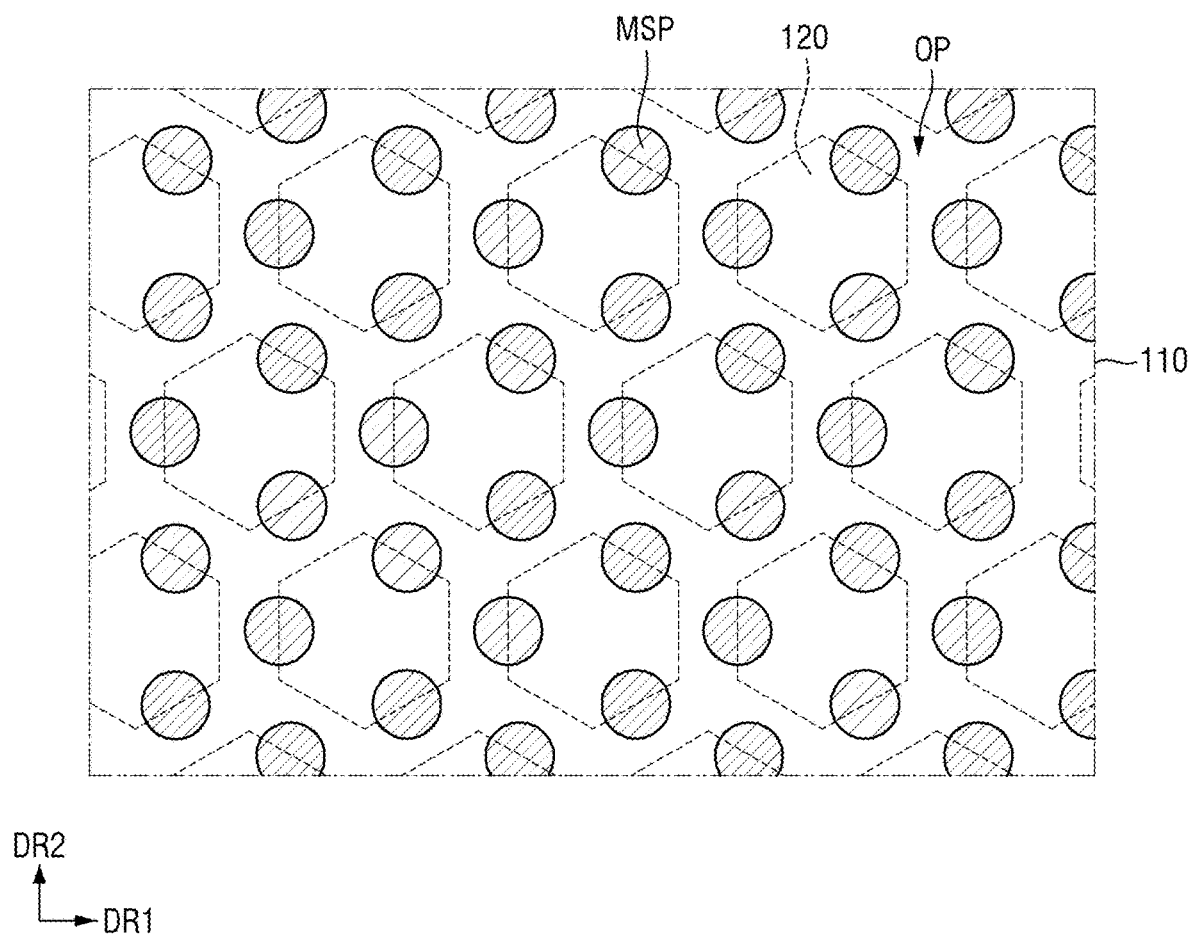
FIG. 17 is a plan view illustrating a manufacturing process of a light-emitting element according to another embodiment.

FIG. 16 is a cross-sectional view illustrating a manufacturing process of a light-emitting element according to another embodiment; and FIG. 17 is a plan view illustrating the manufacturing process of the light-emitting element according to another embodiment.

Referring to FIGS. 16 and 17, openings OP overlapping a plurality of protrusions 120 and a rod area 125 are formed on a semiconductor structure 200, and a plurality of mask patterns MSP overlapping the rod area 125 are formed on the semiconductor structure 200. Unlike the embodiment described above, each of the plurality of mask patterns MSP may be disposed to overlap not only the rod area 125 but also at least a portion of each of the plurality of protrusions 120.

As described above, the threading dislocations may be formed at a high density at the peak disposed at an uppermost end of each of the plurality of protrusions 120, and the threading dislocations may be formed at a relatively low density at the other area of each of the plurality of protrusions 120. That is, the threading dislocations are formed at a high density at an area adjacent to the peak of each of the plurality of protrusions 120, and the density of the threading dislocations gradually decreases as the distance from the peak increases. Accordingly, in an embodiment, each of the plurality of mask patterns MSP may be disposed to overlap at least a portion of each of the plurality of protrusions 120.

The mask pattern MSP may at least partially overlap the protrusion 120. The mask pattern MSP may be disposed to overlap at least one side of the planar shape of the protrusion 120. In an embodiment, the mask patterns MSP may respectively overlap three sides of the protrusion 120 having a hexagonal plane shape. In an embodiment, a planar area of the mask pattern MSP overlapping the protrusion 120 may be 50% or less of that of the mask pattern MSP. The larger the planar area of the mask pattern MSP overlapping the protrusion 120, the closer the mask pattern MSP to the peak of the protrusion 120, and, thus, a plurality of threading dislocations may be included in the manufactured light-emitting element. In the present embodiment, the planar area of the mask pattern MSP overlapping the protrusion 120 may be formed to be 50% or less of that of the mask pattern MSP. As a result, among the planar area of the element rod formed by the mask pattern MSP, the area overlapping the protrusion 120 may be formed to be less than 50% of that of the element rod. Accordingly, the threading dislocations of the light-emitting element manufactured by the element rod may be minimized or reduced.

Figure 18:
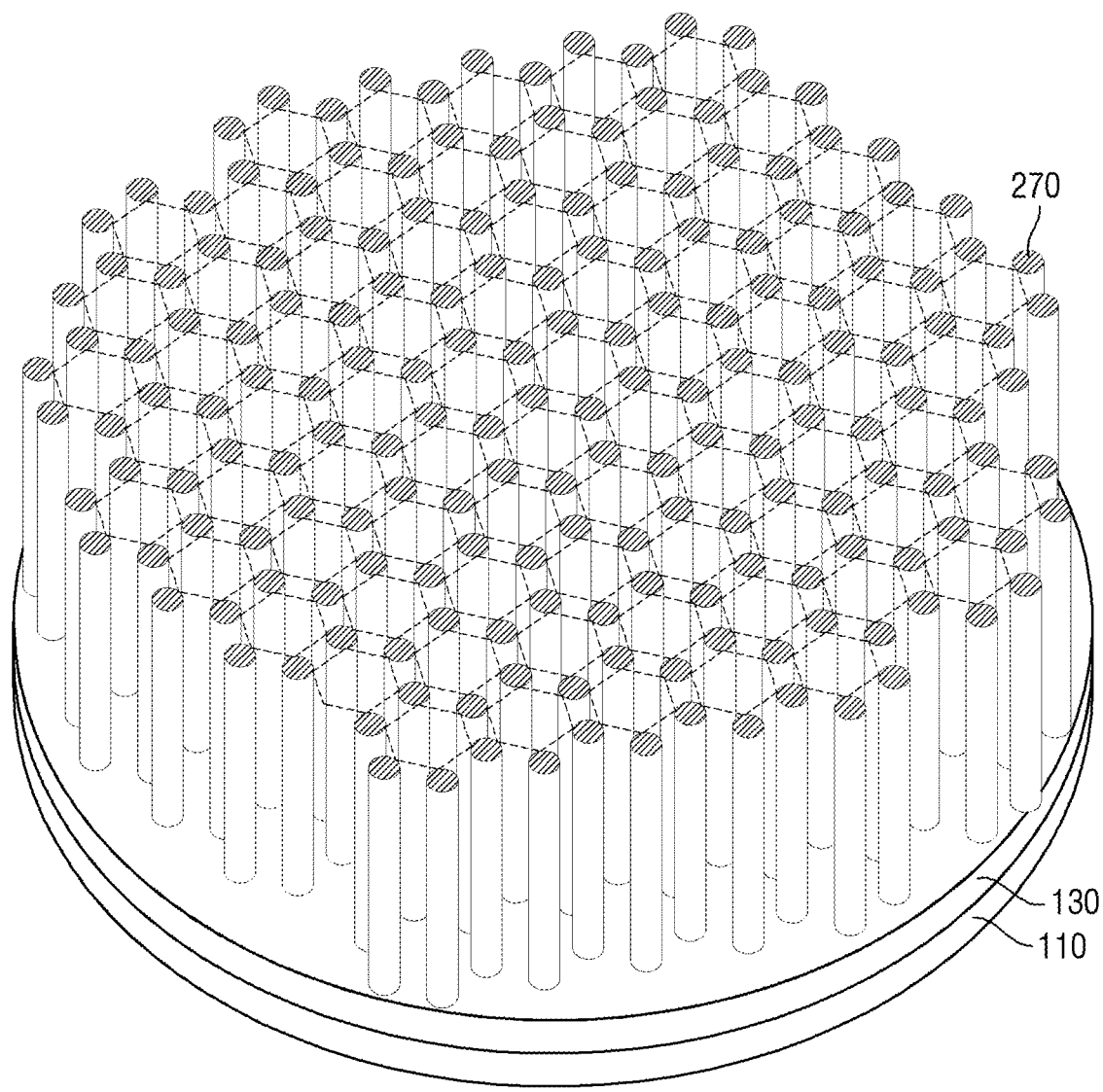
FIG. 18 is a perspective view illustrating a light-emitting element array substrate according to an embodiment.

FIG. 18 is a perspective view of a light-emitting element array substrate according to an embodiment.

Figure 14:
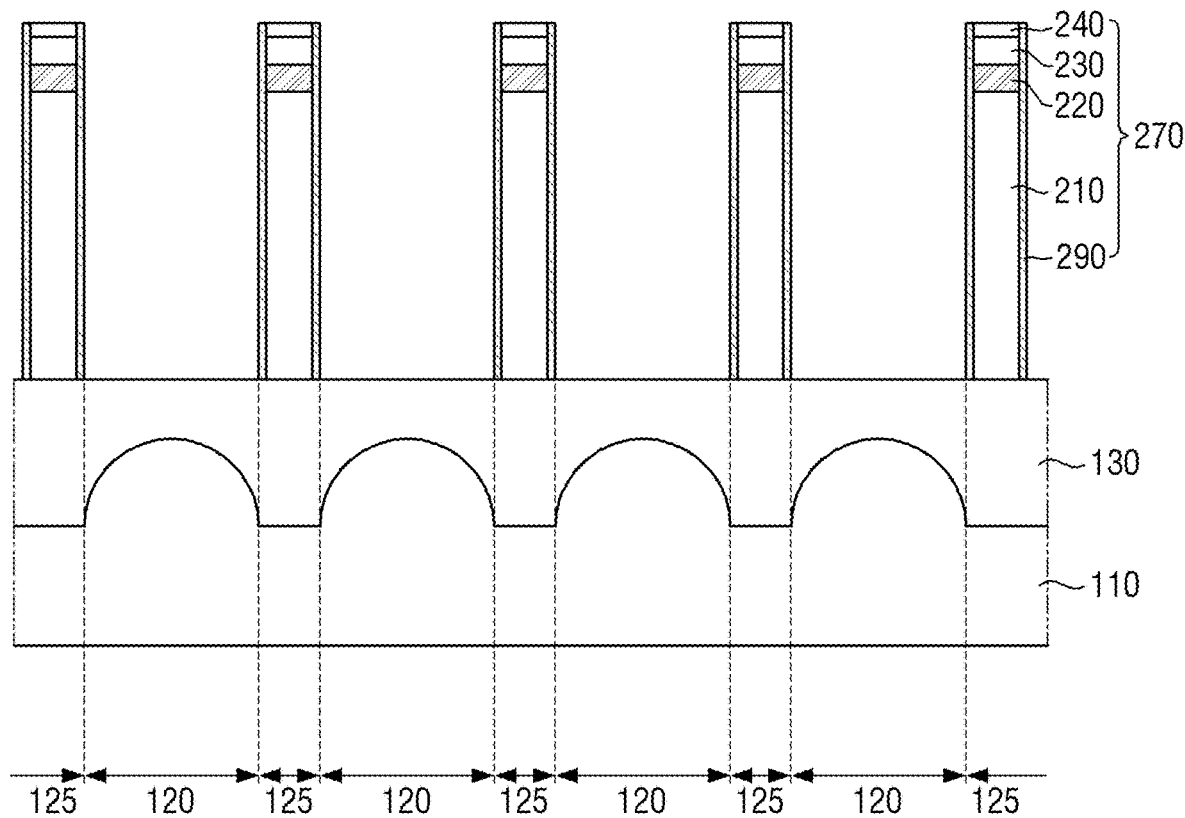

Referring to FIG. 18 together with FIG. 14 described above, a light-emitting element array substrate according to an embodiment may include a base substrate 110, a buffer layer 130 disposed on the base substrate 110, a plurality of element rods 270 disposed on the buffer layer 130, and an insulating film 290 surrounding an outer surface of each of the plurality of element rods 270.

The light-emitting element array substrate may be a substrate for forming light-emitting elements before separating the plurality of element rods 270 therefrom. The base substrate 110 may include a plurality of protrusions 120 and a rod area 125. The plurality of element rods 270 may overlap the rod area 125 and not overlap the plurality of protrusions 120. In another embodiment, each of the plurality of element rods 270 may overlap the rod area 125 and at least a portion of each of the plurality of protrusions 120.

In an embodiment, each of the plurality of element rods 270 is disposed not to overlap each of the plurality of protrusions 120 in which the density of threading dislocations is high, such that threading dislocations of the element rod 270 may be minimized or reduced. Accordingly, threading dislocations of the light-emitting elements 30, which are manufactured using the light-emitting element array substrate, may be minimized or reduced, such that emission defects and leakage current of the light-emitting elements 30 may be reduced, thereby improving light emission efficiency.

Figure 19:
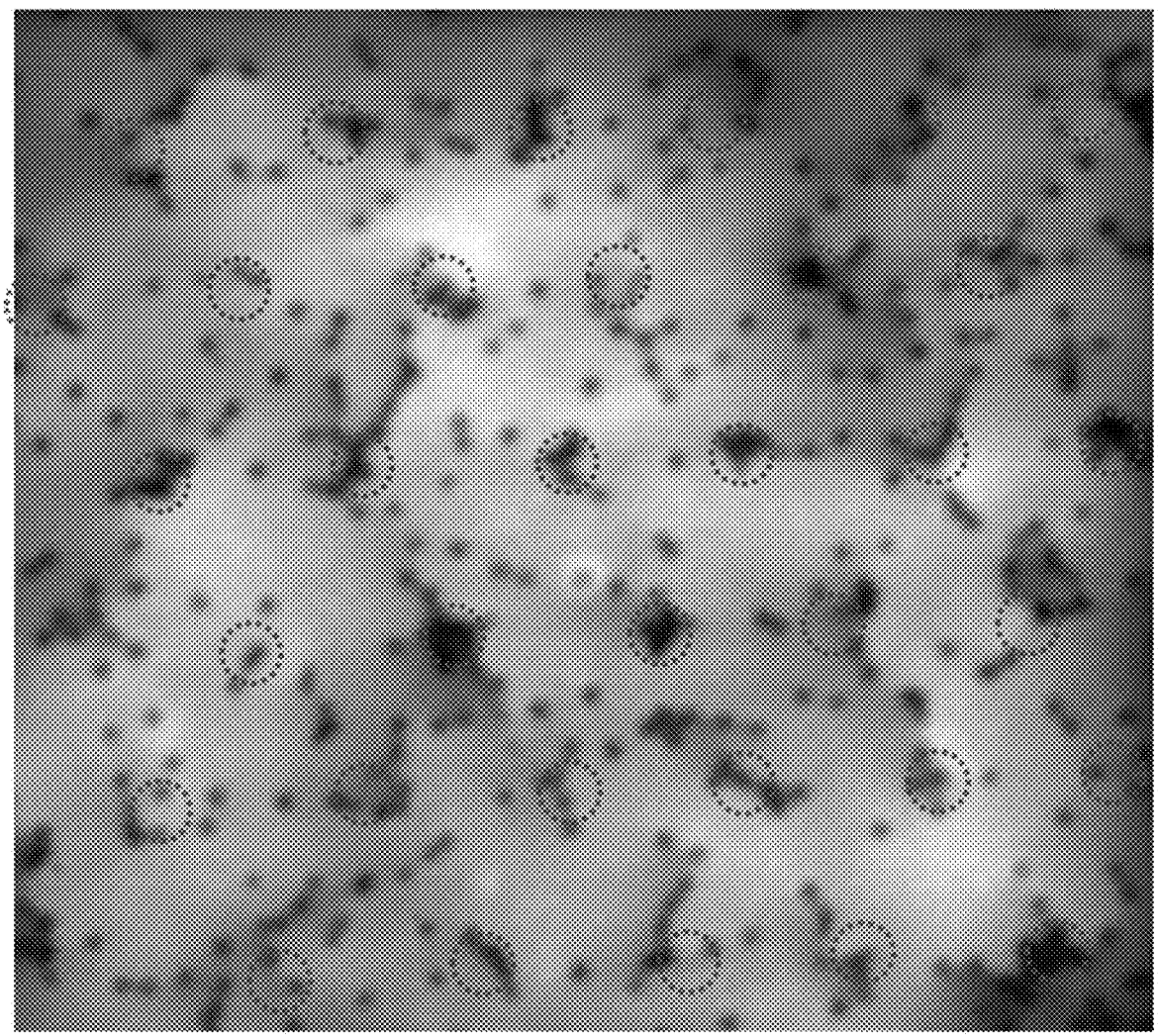
FIG. 19 is a panchromatic cathodoluminescence image of a light-emitting element array substrate according to a manufacturing example.

FIG. 19 is a panchromatic cathodoluminescence image of a light-emitting element array substrate according to a manufacturing example.

The light-emitting element array substrate manufactured according to a manufacturing example was manufactured by growing element rods regardless of the arrangement of a plurality of protrusions. A panchromatic image obtained by observing the light-emitting element array substrate with a scanning electron microscope (SEM) after allowing cathodoluminescence to occur on the light-emitting element array substrate is illustrated in FIG. 19. Circles marked with dotted lines in FIG. 19 are areas in which the plurality of protrusions are disposed, black dots are element rods that do not emit light, and the remaining brightly appearing portions are element rods that emit light.

Referring to FIG. 19, it was found that the areas in which the element rods that do not emit light are disposed substantially overlap the areas in which the plurality of protrusions are disposed. Accordingly, it can be seen that the element rods overlapping the plurality of protrusions have a plurality of defects caused by threading dislocations. In particular, it was found that the ratio of element rods overlapping peaks of the plurality of protrusions among the element rods was 8.5%. On the other hand, in the light-emitting element array substrate according to an embodiment, the ratio of element rods overlapping the peaks of the plurality of protrusions among the element rods may be 0% by disposing the element rods not to overlap the plurality of protrusions or to partially overlap the plurality of protrusions.

Figure 20:
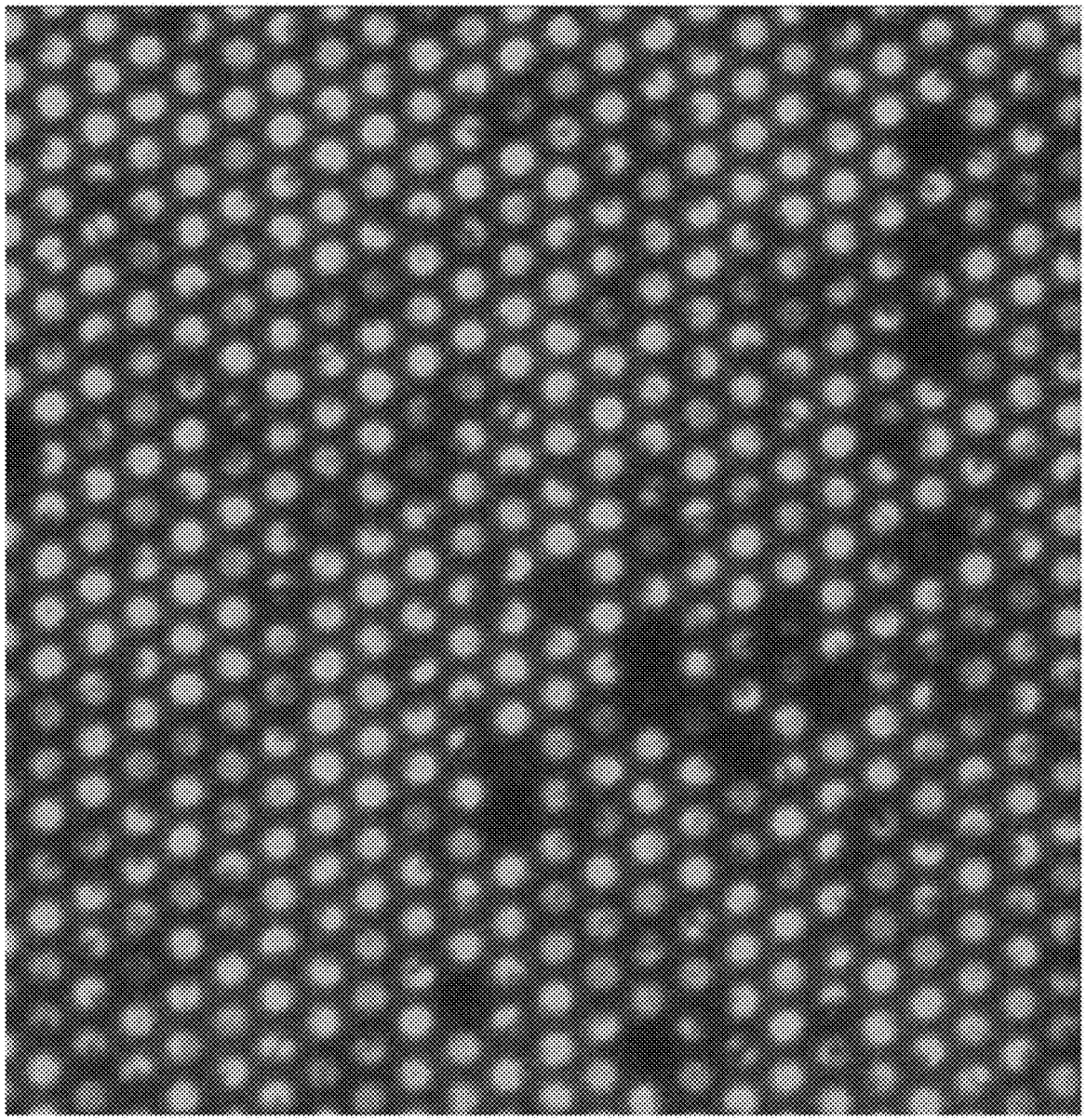
FIG. 20 is a light emission image of the light-emitting element array substrate according to the manufacturing example.

FIG. 20 is a light emission image of the light-emitting element array substrate according to the manufacturing example. An image obtained by irradiating the light-emitting element array substrate according to the manufacturing example with ultraviolet (UV) light to allow the light-emitting element array substrate to emit light was illustrated in FIG. 20.

Referring to FIG. 20, element rods that emit light normally and element rods with defects, such as flicker, partially non-light emitting, totally non-light emitting, and very weak light emission were observed on the light-emitting element array substrate. Here, normal light emission means that a light emitting shape is formed in a completely circular shape in an element rod. In the entire light-emitting element array substrate according to the manufacturing example, among the about 485 element rods, the number of element rods that normally emit light is about 170, accounting for about 35.05%.

Through this, it can be seen that the ratio of the element rods that normally emit light may be at least 35% or more in the light-emitting element array substrate according to an embodiment by disposing the element rods not to overlap or to partially overlap the plurality of protrusions having a high density of threading dislocations.

According to a method of manufacturing a light-emitting element and a light-emitting element array substrate according to embodiments, light emission efficiency can be improved by minimizing or reducing threading dislocations of the light-emitting element and thereby reducing emission defects and leakage current of the light-emitting element.

However, aspects and effects according to embodiments are not limited by the above description, and more various aspects and effects are included in the present disclosure.

While some embodiments have been described herein, those skilled in the art will appreciate that many variations and modifications can be made to the embodiments without substantially departing from the principles of the present invention. Therefore, the disclosed embodiments of the present invention are provided in a generic and descriptive sense and not for purposes of limitation.

What is claimed is:

1. A light-emitting element array substrate comprising:
a base substrate comprising a plurality of protrusions and a rod area which is an area of the base substrate that does not overlap the plurality of protrusions;
a buffer layer on the base substrate;
a plurality of element rods spaced apart from each other on the buffer layer along a first direction, each of the plurality of element rods comprising a first semiconductor material layer, a light-emitting material layer, a second semiconductor material layer, and an electrode material layer which overlap the rod area along a second direction intersecting the first direction; and
an insulating film extending in the second direction around an outer surface, from a first end to a second end, of each of the plurality of element rods and directly contacting at least one of the first semiconductor material layer, the light-emitting material layer, and the second semiconductor material layer,
wherein the plurality of element rods do not overlap the plurality of protrusions in the second direction, and
wherein the first end is a bottom surface of the first semiconductor material layer and the second end is a top surface of the electrode material layer, wherein each of the plurality of protrusions has a conical shape or a pyramid shape.

2. The light-emitting element array substrate of claim 1, wherein each of the plurality of element rods is adjacent to a vertex of a planar shape of a protrusion of the plurality of protrusions.

3. The light-emitting element array substrate of claim 1, wherein, when the light-emitting element array substrate is irradiated with ultraviolet light such that the plurality of element rods emits light, a ratio of the plurality of element rods that emit light in a completely circular shape is 35% or more.

4. The light-emitting element array substrate of claim 1, wherein each of the plurality of element rods comprises the first semiconductor material layer, the light-emitting material layer arranged on the first semiconductor material layer, and the second semiconductor material layer arranged on the light-emitting material layer.

* * * * *